US 7,999,263 B2

(12) United States Patent
Murakami et al.

(10) Patent No.: US 7,999,263 B2
(45) Date of Patent: Aug. 16, 2011

(54) SEMICONDUCTOR ELEMENT AND DISPLAY DEVICE USING THE SAME

(75) Inventors: Satoshi Murakami, Atsugi (JP); Masahiko Hayakawa, Atsugi (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 73 days.

(21) Appl. No.: 11/196,251

(22) Filed: Aug. 4, 2005

(65) Prior Publication Data

US 2005/0282305 A1   Dec. 22, 2005

Related U.S. Application Data

(62) Division of application No. 10/407,184, filed on Apr. 7, 2003, now Pat. No. 7,038,239.

(30) Foreign Application Priority Data

Apr. 9, 2002   (JP) .................................. 2002-107197

(51) Int. Cl.
  *H01L 27/14*   (2006.01)
  *H01L 29/04*   (2006.01)
  *H01L 29/15*   (2006.01)
  *H01L 31/036*   (2006.01)
(52) U.S. Cl. ...................... 257/72; 257/59; 257/E27.001
(58) Field of Classification Search .................... 257/59, 257/72; 438/149
See application file for complete search history.

(56) References Cited

U.S. PATENT DOCUMENTS

| | | |
|---|---|---|
| 3,597,667 A | 8/1971 | Horn |
| 4,313,782 A | 2/1982 | Sokoloski |
| 4,342,617 A | 8/1982 | Fu et al. |
| 4,347,586 A | 8/1982 | Natsui |
| 4,409,724 A | 10/1983 | Tasch et al. |
| 4,447,272 A | 5/1984 | Saks |

(Continued)

FOREIGN PATENT DOCUMENTS

EP   0 556 484 A1   8/1993

(Continued)

OTHER PUBLICATIONS

Search Report for Taiwan Invention Patent Application No. 092108032, Dated: Jan. 14, 2008, with translation.

(Continued)

*Primary Examiner* — Kenneth A Parker
*Assistant Examiner* — Anthony Ho
(74) *Attorney, Agent, or Firm* — Nixon Peabody LLP; Jeffrey L. Costellia

(57) ABSTRACT

Provided is a semiconductor element including: a semiconductor having an active layer; a gate insulating film which is in contact with the semiconductor; a gate electrode opposite to the active layer through the gate insulating film; a first nitride insulating film formed over the active layer; a photosensitive organic resin film formed on the first nitride insulating film; a second nitride insulating film formed on the photosensitive organic resin film; and a wiring provided on the second nitride insulating film, in which a first opening portion is provided in the photosensitive organic resin film, an inner wall surface of the first opening portion is covered with the second nitride insulating film, a second opening portion is provided in a laminate including the gate insulating film, the first nitride insulating film, and the second nitride insulating film inside the first opening portion, and the semiconductor is connected with the wiring through the first opening portion and the second opening portion.

33 Claims, 17 Drawing Sheets

U.S. PATENT DOCUMENTS

| | | | |
|---|---|---|---|
| 4,566,175 A | 1/1986 | Smayling et al. |
| 4,651,406 A | 3/1987 | Shimizu et al. |
| 4,808,845 A | 2/1989 | Suzuki et al. |
| 4,823,180 A | 4/1989 | Wieder et al. |
| 4,851,370 A | 7/1989 | Doklan et al. |
| 4,886,962 A | 12/1989 | Gofuku et al. |
| 4,951,100 A | 8/1990 | Parrillo |
| 5,055,906 A | 10/1991 | Mase et al. |
| 5,063,378 A | 11/1991 | Roach |
| RE33,829 E | 2/1992 | Castleberry |
| 5,102,813 A | 4/1992 | Kobayashi et al. |
| 5,113,511 A | 5/1992 | Nelson et al. |
| 5,142,344 A | 8/1992 | Yamazaki |
| 5,169,792 A | 12/1992 | Katoh et al. |
| 5,182,620 A | 1/1993 | Shimada et al. |
| 5,191,373 A | 3/1993 | Nakano |
| 5,198,685 A | 3/1993 | Kitani et al. |
| 5,212,119 A | 5/1993 | Hah et al. |
| 5,247,289 A | 9/1993 | Matsueda |
| 5,292,675 A | 3/1994 | Codama |
| 5,292,677 A | 3/1994 | Dennison |
| 5,306,651 A | 4/1994 | Masumo et al. |
| 5,308,998 A | 5/1994 | Yamazaki et al. |
| 5,313,076 A | 5/1994 | Yamazaki et al. |
| 5,324,974 A | 6/1994 | Liao |
| 5,343,066 A | 8/1994 | Okamoto et al. |
| 5,359,206 A | 10/1994 | Yamamoto et al. |
| 5,365,079 A | 11/1994 | Kodaira et al. |
| 5,414,278 A | 5/1995 | Kobayashi et al. |
| 5,414,442 A | 5/1995 | Yamazaki et al. |
| 5,424,752 A | 6/1995 | Yamazaki et al. |
| 5,426,315 A | 6/1995 | Pfiester |
| 5,440,163 A | 8/1995 | Ohhashi |
| 5,444,457 A | 8/1995 | Hotto |
| 5,446,562 A | 8/1995 | Sato |
| 5,459,596 A | 10/1995 | Ueda et al. |
| 5,466,617 A | 11/1995 | Shannon |
| 5,468,987 A | 11/1995 | Yamazaki et al. |
| 5,476,802 A | 12/1995 | Yamazaki et al. |
| 5,479,052 A | 12/1995 | Yuuki |
| 5,485,019 A | 1/1996 | Yamazaki et al. |
| 5,497,021 A | 3/1996 | Tada |
| 5,498,562 A | 3/1996 | Dennison et al. |
| 5,499,123 A | 3/1996 | Mikoshiba |
| 5,504,020 A | 4/1996 | Aomori et al. |
| 5,504,029 A | 4/1996 | Murata et al. |
| 5,508,209 A | 4/1996 | Zhang et al. |
| 5,512,779 A | 4/1996 | Noda |
| 5,521,107 A | 5/1996 | Yamazaki et al. |
| 5,523,257 A | 6/1996 | Yamazaki et al. |
| 5,545,577 A | 8/1996 | Tada |
| 5,563,427 A | 10/1996 | Yudasaka et al. |
| 5,576,231 A | 11/1996 | Konuma et al. |
| 5,576,655 A | 11/1996 | Fujihira et al. |
| 5,580,381 A | 12/1996 | Yamagata |
| 5,583,369 A | 12/1996 | Yamazaki et al. |
| 5,585,949 A | 12/1996 | Yamazaki et al. |
| 5,585,951 A | 12/1996 | Noda et al. |
| 5,612,254 A | 3/1997 | Mu et al. |
| 5,619,045 A | 4/1997 | Konuma et al. |
| 5,620,905 A | 4/1997 | Konuma et al. |
| 5,623,157 A | 4/1997 | Miyazaki et al. |
| 5,627,084 A | 5/1997 | Yamazaki et al. |
| 5,635,423 A | 6/1997 | Huang et al. |
| 5,650,338 A | 7/1997 | Yamazaki et al. |
| 5,663,077 A | 9/1997 | Adachi et al. |
| 5,672,900 A | 9/1997 | Konuma et al. |
| 5,674,771 A | 10/1997 | Machida et al. |
| 5,680,147 A | 10/1997 | Yamazaki et al. |
| 5,696,386 A | 12/1997 | Yamazaki |
| 5,706,064 A | 1/1998 | Fukunaga et al. |
| 5,712,495 A | 1/1998 | Suzawa |
| 5,719,065 A | 2/1998 | Takemura et al. |
| 5,721,601 A | 2/1998 | Yamaji et al. |
| 5,729,035 A | 3/1998 | Anma |
| 5,733,797 A | 3/1998 | Yamaha |
| 5,737,049 A | 4/1998 | Shin et al. |
| 5,747,355 A | 5/1998 | Konuma et al. |
| 5,771,110 A | 6/1998 | Hirano et al. |
| 5,781,254 A | 7/1998 | Kim et al. |
| 5,784,073 A | 7/1998 | Yamazaki et al. |
| 5,786,241 A | 7/1998 | Shimada |
| 5,789,762 A | 8/1998 | Koyama et al. |
| 5,804,878 A | 9/1998 | Miyazaki et al. |
| 5,805,252 A | 9/1998 | Shimada et al. |
| 5,808,315 A | 9/1998 | Murakami et al. |
| 5,814,529 A | 9/1998 | Zhang |
| 5,815,226 A | 9/1998 | Yamazaki et al. |
| 5,818,550 A | 10/1998 | Kadota et al. |
| 5,831,284 A | 11/1998 | Park et al. |
| 5,847,410 A | 12/1998 | Nakajima |
| 5,849,611 A | 12/1998 | Yamazaki et al. |
| 5,879,969 A | 3/1999 | Yamazaki et al. |
| 5,880,038 A | 3/1999 | Yamazaki et al. |
| 5,893,623 A | 4/1999 | Muramatsu |
| 5,895,937 A * | 4/1999 | Su et al. ........................... 257/59 |
| 5,913,112 A | 6/1999 | Yamazaki et al. |
| 5,917,225 A | 6/1999 | Yamazaki et al. |
| 5,926,702 A | 7/1999 | Kwon et al. |
| 5,939,731 A | 8/1999 | Yamazaki et al. |
| 5,940,732 A | 8/1999 | Zhang |
| 5,945,711 A | 8/1999 | Takemura et al. |
| 5,946,561 A | 8/1999 | Yamazaki et al. |
| 5,956,105 A | 9/1999 | Yamazaki et al. |
| 5,962,870 A | 10/1999 | Yamazaki et al. |
| 5,962,872 A | 10/1999 | Zhang et al. |
| 5,982,460 A | 11/1999 | Zhang et al. |
| 5,990,542 A | 11/1999 | Yamazaki |
| 6,013,928 A | 1/2000 | Yamazaki et al. |
| 6,031,290 A | 2/2000 | Miyazaki et al. |
| 6,037,712 A | 3/2000 | Codama et al. |
| 6,057,904 A | 5/2000 | Kim et al. |
| 6,069,443 A | 5/2000 | Jones et al. |
| 6,078,316 A | 6/2000 | Page et al. |
| 6,115,090 A | 9/2000 | Yamazaki |
| 6,124,904 A | 9/2000 | Sato |
| 6,136,624 A | 10/2000 | Kemmochi et al. |
| 6,141,066 A | 10/2000 | Matsushima |
| 6,147,375 A | 11/2000 | Yamazaki et al. |
| 6,150,692 A | 11/2000 | Iwanaga et al. |
| 6,166,414 A | 12/2000 | Miyazaki et al. |
| 6,215,154 B1 | 4/2001 | Ishida et al. |
| 6,236,106 B1 | 5/2001 | Sato |
| 6,252,297 B1 | 6/2001 | Kemmochi et al. |
| 6,271,066 B1 | 8/2001 | Yamazaki et al. |
| 6,271,543 B1 | 8/2001 | Ohtani et al. |
| 6,274,516 B1 | 8/2001 | Kamei et al. |
| 6,274,887 B1 | 8/2001 | Yamazaki et al. |
| 6,294,799 B1 | 9/2001 | Yamazaki et al. |
| 6,306,559 B1 | 10/2001 | Tanamura et al. |
| 6,306,694 B1 | 10/2001 | Yamazaki et al. |
| 6,320,224 B1 | 11/2001 | Zhang |
| 6,335,555 B1 | 1/2002 | Takemura et al. |
| 6,346,718 B1 | 2/2002 | Yamanaka et al. |
| 6,356,318 B1 | 3/2002 | Kawahata |
| 6,372,558 B1 | 4/2002 | Yamanaka et al. |
| 6,429,053 B1 | 8/2002 | Yamazaki et al. |
| 6,448,612 B1 | 9/2002 | Miyazaki et al. |
| 6,451,636 B1 | 9/2002 | Segawa et al. |
| 6,475,836 B1 | 11/2002 | Suzawa et al. |
| 6,476,447 B1 | 11/2002 | Yamazaki et al. |
| 6,492,659 B1 | 12/2002 | Yamazaki et al. |
| 6,493,271 B2 | 12/2002 | Matsubara et al. |
| 6,514,855 B1 | 2/2003 | Suzuki et al. |
| 6,515,300 B2 | 2/2003 | Boer et al. |
| 6,521,913 B1 | 2/2003 | Murade |
| 6,528,824 B2 | 3/2003 | Yamagata et al. |
| 6,538,301 B1 | 3/2003 | Yamada et al. |
| 6,556,257 B2 | 4/2003 | Ino |
| 6,562,672 B2 | 5/2003 | Yamazaki et al. |
| 6,566,711 B1 | 5/2003 | Yamazaki et al. |
| 6,576,926 B1 | 6/2003 | Yamazaki et al. |
| 6,580,475 B2 | 6/2003 | Yamazaki et al. |
| 6,593,990 B1 | 7/2003 | Yamazaki |
| 6,599,818 B2 | 7/2003 | Dairiki |
| 6,605,826 B2 | 8/2003 | Yamazaki et al. |
| 6,608,353 B2 | 8/2003 | Miyazaki et al. |

| | | |
|---|---|---|
| 6,614,076 B2 | 9/2003 | Kawasaki et al. |
| 6,617,611 B2 | 9/2003 | Hasegawa et al. |
| 6,624,450 B1 | 9/2003 | Yamazaki et al. |
| 6,657,230 B1 | 12/2003 | Murade |
| 6,657,260 B2 | 12/2003 | Yamazaki et al. |
| 6,664,145 B1 | 12/2003 | Yamazaki et al. |
| 6,664,732 B2 | 12/2003 | Yamazaki et al. |
| 6,677,621 B2 | 1/2004 | Yamazaki et al. |
| 6,680,577 B1 | 1/2004 | Inukai et al. |
| 6,689,492 B1 | 2/2004 | Yamazaki et al. |
| 6,690,031 B1 | 2/2004 | Ohtani et al. |
| 6,690,033 B2 | 2/2004 | Yamazaki et al. |
| 6,730,948 B2 * | 5/2004 | Umeda et al. ............ 257/295 |
| 6,739,931 B2 | 5/2004 | Yamazaki et al. |
| 6,740,599 B2 | 5/2004 | Yamazaki et al. |
| 6,768,259 B2 | 7/2004 | Hirano |
| 6,774,578 B2 | 8/2004 | Tanada |
| 6,777,710 B1 | 8/2004 | Koyama |
| 6,778,232 B2 | 8/2004 | Nakata et al. |
| 6,784,037 B2 | 8/2004 | Yamazaki et al. |
| 6,784,949 B1 | 8/2004 | Nagata et al. |
| 6,791,129 B2 | 9/2004 | Inukai |
| 6,791,521 B2 | 9/2004 | Isami et al. |
| 6,822,264 B2 | 11/2004 | Yamazaki et al. |
| 6,822,629 B2 | 11/2004 | Yamazaki et al. |
| 6,828,950 B2 | 12/2004 | Koyama |
| 6,833,560 B2 | 12/2004 | Konuma et al. |
| 6,842,660 B2 | 1/2005 | Tripathi et al. |
| 6,855,954 B1 | 2/2005 | Zhang |
| 6,864,628 B2 | 3/2005 | Yamazaki et al. |
| 6,875,999 B2 | 4/2005 | Koyama et al. |
| 6,900,462 B2 | 5/2005 | Suzawa et al. |
| 6,903,377 B2 | 6/2005 | Yamazaki et al. |
| 6,905,903 B2 | 6/2005 | Hasegawa et al. |
| 6,909,114 B1 | 6/2005 | Yamazaki |
| 6,911,688 B2 | 6/2005 | Yamazaki et al. |
| 6,936,846 B2 | 8/2005 | Koyama et al. |
| 6,940,180 B1 | 9/2005 | Uchiyama |
| 6,943,369 B2 | 9/2005 | Hayashi |
| 6,958,489 B2 | 10/2005 | Kimura |
| 6,967,129 B2 | 11/2005 | Yamazaki et al. |
| 6,972,263 B2 | 12/2005 | Yamazaki et al. |
| 6,972,435 B2 | 12/2005 | Ohtani |
| 6,977,392 B2 | 12/2005 | Yamazaki et al. |
| 6,977,394 B2 | 12/2005 | Yamazaki et al. |
| 6,987,283 B2 | 1/2006 | Zhang et al. |
| 7,038,239 B2 | 5/2006 | Murakami et al. |
| 7,042,024 B2 | 5/2006 | Yamazaki et al. |
| 7,045,399 B2 | 5/2006 | Miyazaki et al. |
| 7,061,016 B2 | 6/2006 | Miyazaki et al. |
| 7,084,517 B2 | 8/2006 | Uchiyama |
| 7,132,693 B2 | 11/2006 | Konuma et al. |
| 7,141,821 B1 | 11/2006 | Yamazaki et al. |
| 7,142,781 B2 | 11/2006 | Koyama et al. |
| 7,148,510 B2 | 12/2006 | Yamazaki et al. |
| 7,242,021 B2 | 7/2007 | Yamazaki et al. |
| 7,301,209 B2 | 11/2007 | Takemura et al. |
| 7,365,393 B2 | 4/2008 | Yamazaki et al. |
| 7,375,376 B2 | 5/2008 | Yamazaki et al. |
| 7,422,934 B2 | 9/2008 | Yamazaki et al. |
| 7,442,991 B2 | 10/2008 | Yamazaki et al. |
| 7,615,786 B2 | 11/2009 | Takemura et al. |
| 7,671,369 B2 | 3/2010 | Yamazaki et al. |
| 2001/0005606 A1 | 6/2001 | Tanaka et al. |
| 2001/0009283 A1 | 7/2001 | Arao et al. |
| 2001/0030322 A1 | 10/2001 | Yamazaki et al. |
| 2001/0036462 A1 | 11/2001 | Fong et al. |
| 2001/0051416 A1 | 12/2001 | Yamazaki et al. |
| 2001/0053559 A1 | 12/2001 | Nagao et al. |
| 2001/0055841 A1 | 12/2001 | Yamazaki et al. |
| 2002/0036462 A1 | 3/2002 | Hirano |
| 2002/0050786 A1 | 5/2002 | Yamazaki et al. |
| 2002/0051382 A1 | 5/2002 | Matsubara et al. |
| 2002/0052124 A1 | 5/2002 | Raaijmakers et al. |
| 2002/0055206 A1 | 5/2002 | Zhang |
| 2002/0145116 A1 | 10/2002 | Choo et al. |
| 2002/0155706 A1 | 10/2002 | Mitsuki et al. |
| 2002/0163043 A1 | 11/2002 | Zhang et al. |
| 2002/0177326 A1 | 11/2002 | Klee et al. |
| 2002/0179969 A1 | 12/2002 | Miyazaki et al. |
| 2003/0057419 A1 | 3/2003 | Murakami et al. |
| 2003/0090447 A1 | 5/2003 | Kimura |
| 2003/0129790 A1 | 7/2003 | Yamazaki et al. |
| 2003/0162314 A1 | 8/2003 | Yamazaki et al. |
| 2003/0173570 A1 | 9/2003 | Yamazaki et al. |
| 2003/0189207 A1 | 10/2003 | Murakami et al. |
| 2003/0189210 A1 | 10/2003 | Yamazaki et al. |
| 2003/0193054 A1 | 10/2003 | Hayakawa et al. |
| 2003/0197178 A1 | 10/2003 | Yamazaki et al. |
| 2003/0206332 A1 | 11/2003 | Yamazaki et al. |
| 2003/0210358 A1 | 11/2003 | Zhang et al. |
| 2003/0230764 A1 | 12/2003 | Yamazaki et al. |
| 2004/0023445 A1 | 2/2004 | Miyazaki et al. |
| 2004/0051102 A1 | 3/2004 | Miyazaki et al. |
| 2004/0072380 A1 | 4/2004 | Yamazaki et al. |
| 2004/0075094 A1 | 4/2004 | Yamazaki et al. |
| 2004/0080263 A1 | 4/2004 | Yamazaki et al. |
| 2004/0135181 A1 | 7/2004 | Yamazaki et al. |
| 2005/0056948 A1 | 3/2005 | Uchiyama |
| 2005/0087741 A1 | 4/2005 | Yamazaki |
| 2005/0132549 A1 | 6/2005 | Shih et al. |
| 2005/0205868 A1 | 9/2005 | Yamazaki et al. |
| 2005/0233507 A1 | 10/2005 | Yamazaki et al. |
| 2005/0276912 A1 | 12/2005 | Yamamoto et al. |
| 2005/0282305 A1 | 12/2005 | Murakami et al. |
| 2005/0287722 A1 | 12/2005 | Zhang |
| 2006/0060861 A1 | 3/2006 | Yamazaki et al. |
| 2007/0001236 A1 | 1/2007 | Yamazaki et al. |
| 2007/0096106 A1 | 5/2007 | Yamazaki et al. |
| 2007/0096224 A1 | 5/2007 | Takemura et al. |
| 2008/0061299 A1 | 3/2008 | Takemura et al. |
| 2008/0230871 A1 | 9/2008 | Yamazaki et al. |
| 2008/0246039 A1 | 10/2008 | Zhang |
| 2009/0014724 A1 | 1/2009 | Yamazaki et al. |
| 2009/0072235 A1 | 3/2009 | Zhang et al. |
| 2009/0200611 A1 | 8/2009 | Takemura et al. |
| 2010/0025688 A1 | 2/2010 | Murakami et al. |
| 2010/0283067 A1 | 11/2010 | Murakami et al. |
| 2010/0285661 A1 | 11/2010 | Murakami et al. |

FOREIGN PATENT DOCUMENTS

| | | |
|---|---|---|
| EP | 0 603 866 A1 | 6/1994 |
| EP | 0 680 082 A1 | 11/1995 |
| EP | 0 878 840 A1 | 11/1998 |
| EP | 1 031 873 A2 | 8/2000 |
| EP | 1 128 430 A2 | 8/2001 |
| EP | 1128439 A2 | 8/2001 |
| EP | 1148553 A2 | 10/2001 |
| EP | 1566837 A2 | 8/2005 |
| JP | 55-041703 | 3/1980 |
| JP | 56-081973 | 7/1981 |
| JP | 56-111258 | 9/1981 |
| JP | 57-058363 | 4/1982 |
| JP | 57-104218 | 6/1982 |
| JP | 58-037967 | 3/1983 |
| JP | 58-197761 | 11/1983 |
| JP | 60-136259 | 7/1985 |
| JP | 60-202931 | 10/1985 |
| JP | 61-220341 | 9/1986 |
| JP | 62-084562 | 4/1987 |
| JP | 62-274729 | 11/1987 |
| JP | 63-314862 | 12/1988 |
| JP | 64-054762 | 3/1989 |
| JP | 01-156725 | 6/1989 |
| JP | 02-025024 | 1/1990 |
| JP | 02-039541 | 2/1990 |
| JP | 02-044769 | 2/1990 |
| JP | 02-100024 | 4/1990 |
| JP | 02-159730 | 6/1990 |
| JP | 02-214152 | 8/1990 |
| JP | 02-234134 | 9/1990 |
| JP | 03-020046 | 1/1991 |
| JP | 03-095938 | 4/1991 |
| JP | 03-095939 | 4/1991 |
| JP | 03-126921 | 5/1991 |
| JP | 03-280018 | 12/1991 |
| JP | 03-280420 | 12/1991 |
| JP | 04-139828 | 5/1992 |

| | | |
|---|---|---|
| JP | 04-142740 | 5/1992 |
| JP | 04-155834 | 5/1992 |
| JP | 04-180219 | 6/1992 |
| JP | 04-196328 | 7/1992 |
| JP | 04-239731 | 8/1992 |
| JP | 04-299566 | 10/1992 |
| JP | 04-358129 | 12/1992 |
| JP | 05-055581 | 3/1993 |
| JP | 05-055582 | 3/1993 |
| JP | 05-082442 | 4/1993 |
| JP | 05-114724 | 5/1993 |
| JP | 05-226364 | 9/1993 |
| JP | 05-232515 | 9/1993 |
| JP | 05-249478 | 9/1993 |
| JP | 05-259458 | 10/1993 |
| JP | 05-275373 | 10/1993 |
| JP | 05-299581 | 11/1993 |
| JP | 06-067210 | 3/1994 |
| JP | 06-130414 | 5/1994 |
| JP | 06-169086 | 6/1994 |
| JP | 06-232160 | 8/1994 |
| JP | 06-242433 | 9/1994 |
| JP | 06-267210 | 9/1994 |
| JP | 06-267982 | 9/1994 |
| JP | 06-291314 | 10/1994 |
| JP | 06-308531 | 11/1994 |
| JP | 06-337436 | 12/1994 |
| JP | 06-338612 | 12/1994 |
| JP | 07-056190 | 3/1995 |
| JP | 07-273191 | 10/1995 |
| JP | 07-335766 | 12/1995 |
| JP | 08-152651 | 6/1996 |
| JP | 08-181214 | 7/1996 |
| JP | 08-203876 | 8/1996 |
| JP | 10-039334 | 2/1998 |
| JP | 10-048668 | 2/1998 |
| JP | 10-056182 | 2/1998 |
| JP | 10-068972 | 3/1998 |
| JP | 10-307305 | 11/1998 |
| JP | 11-103069 | 4/1999 |
| JP | 11-183929 | 7/1999 |
| JP | 11-345981 | 12/1999 |
| JP | 2000-312007 | 11/2000 |
| JP | 2001-189462 | 7/2001 |
| JP | 2001-223267 | 8/2001 |
| JP | 1122773 A2 | 8/2001 |
| JP | 2001-313397 | 11/2001 |
| JP | 2001-318622 | 11/2001 |
| JP | 2001-318628 | 11/2001 |
| JP | 2001-356711 | 12/2001 |
| JP | 2002-006777 | 1/2002 |
| JP | 2002-026331 | 1/2002 |
| JP | 2003-017273 | 1/2003 |
| KR | 1992-0010788 | 6/1992 |
| TW | 285751 | 9/1996 |
| TW | 354855 | 3/1999 |
| TW | 408246 B | 10/2000 |
| TW | 255974 B | 6/2006 |
| WO | WO-92/14268 | 8/1992 |
| WO | WO 03/038533 A1 | 5/2003 |

OTHER PUBLICATIONS

Shunpei Yamazaki et al., "*Semiconductor Display Device*", U.S. Appl. No. 10/400,427, filed Mar. 28, 2003, (Official Office Action dated Oct. 20, 2004).

Okuyama.K et al., "Water-Related Threshold Voltage Instabilitiy of Polysilicon TFTS,", IEDM 93: Technical Digest of International Electron Devices Meeting, 1993, pp. 527-530.

Bonnel.M et al., "SI Poly TFTS with Low Off-Current for Flat Panel Displays,", Eurodisplay '93 : The 13th International Display Research Conference, 1993, pp. 199-202.

Yamashita. N et al., "Increased Hot-Carrier Degradation Due to Water in TEOS/O3-Oxide,", Extended Abstracts (The 39th Spring Meeting, 1992): The Japan Society of Applied Physics and Related Societies, Mar. 28, 1992, No. 2, p. 723.

Yamashita. N et al., "Increased Hot-Carrier Degradation Due to Water in TEOS/O3-Oxide(2)-Water Blocking Effect of an ECR-SIO2 Film Under TEOS/O3-Oxide and Improvement of Hot-Carrier Tolerance,", Extended Abstracts (The 39th Spring Meeting, 1992): The Japan Society of Applied Physics and Related Societies, Mar. 28, 1992, No. 2, p. 723.

"U.S. Office Action (U.S. Appl. No. 12/533,669; US06368D1-C1) Dated Dec. 23, 2010,".

Office Action (U.S. Appl. No. 12/840,350; US06368D1-C1C1) Dated Feb. 15, 2011.

Office Action (U.S. Appl. No. 12/533,669; US06368D1-C1) Dated Dec. 23, 2010.

Notice of Allowance (U.S. Appl. No. 12/840,349; US06368D1-C1C2) Dated Jan. 27, 2011.

* cited by examiner (n-chTFT)

(p-chTFT)

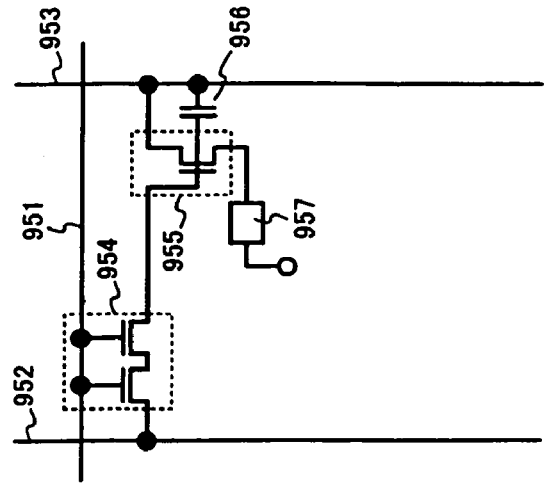
Fig. 9A
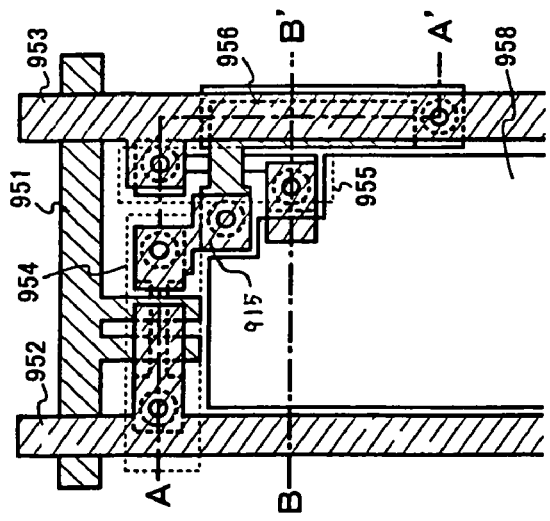
Fig. 9B
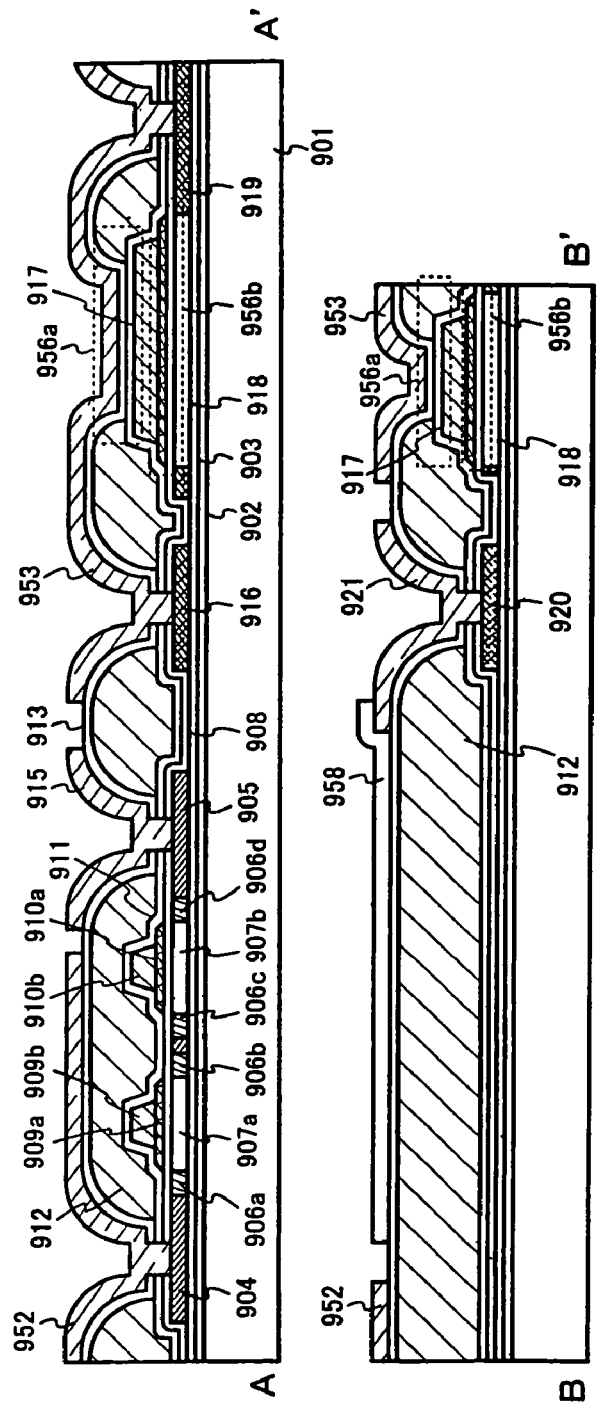
Fig. 9C
Fig. 9D

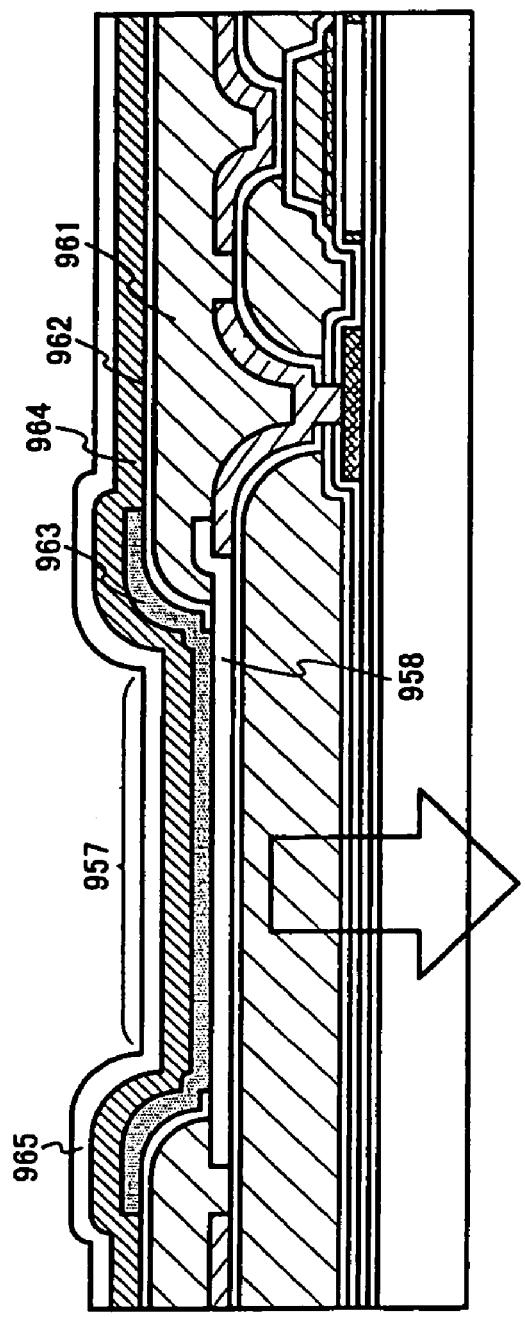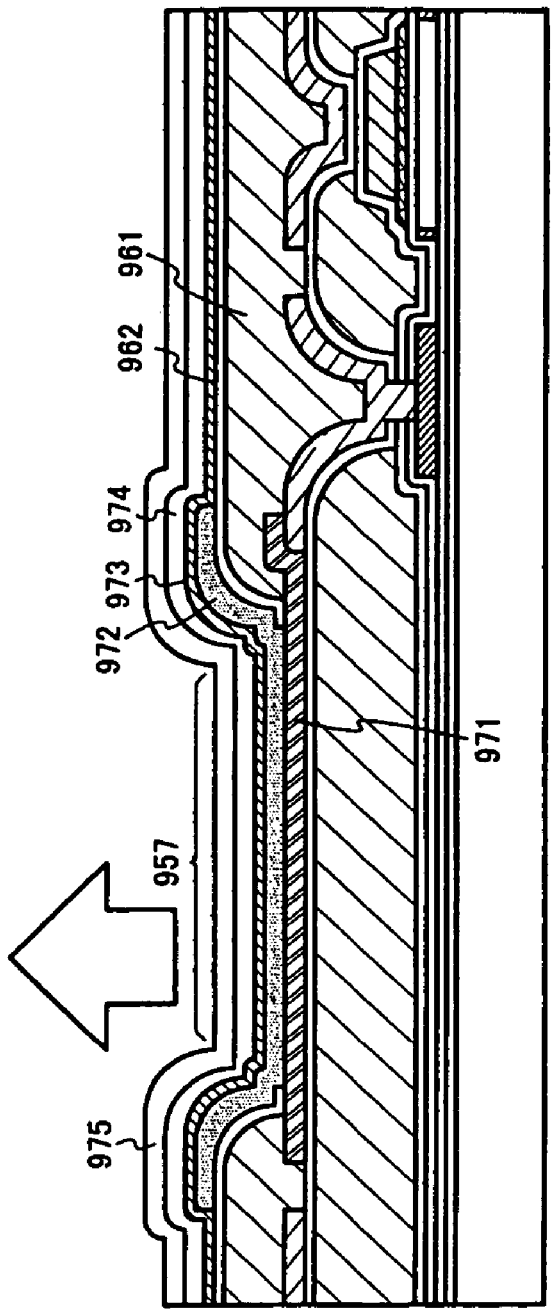

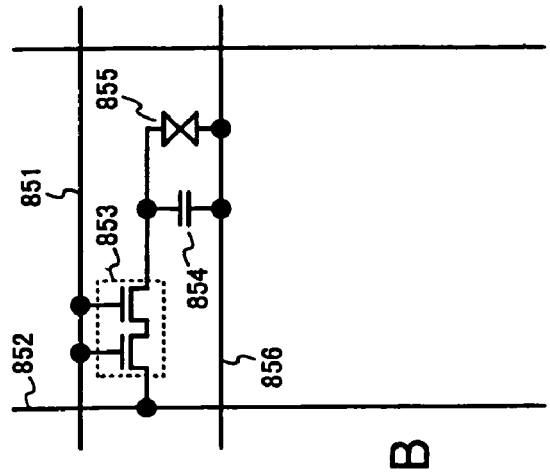
Fig. 13B
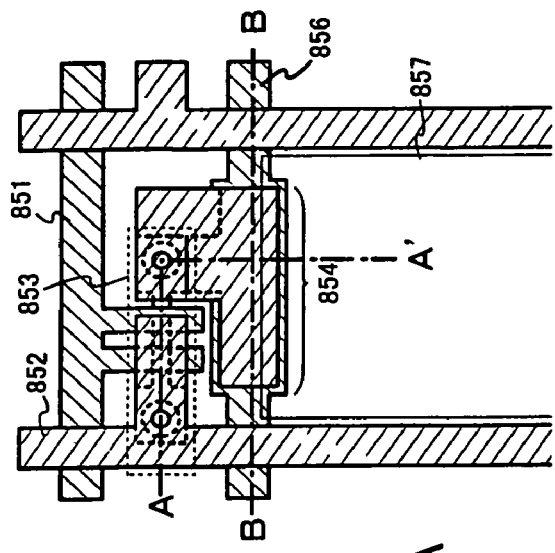
Fig. 13A
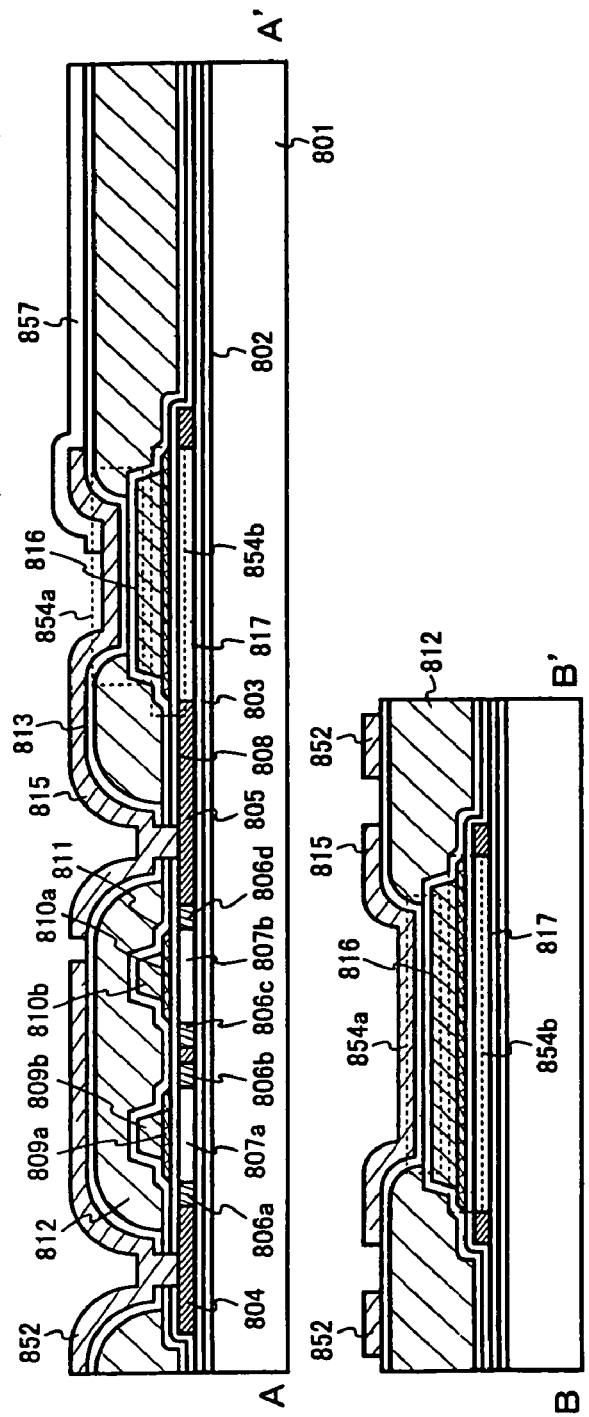
Fig. 13C
Fig. 13D

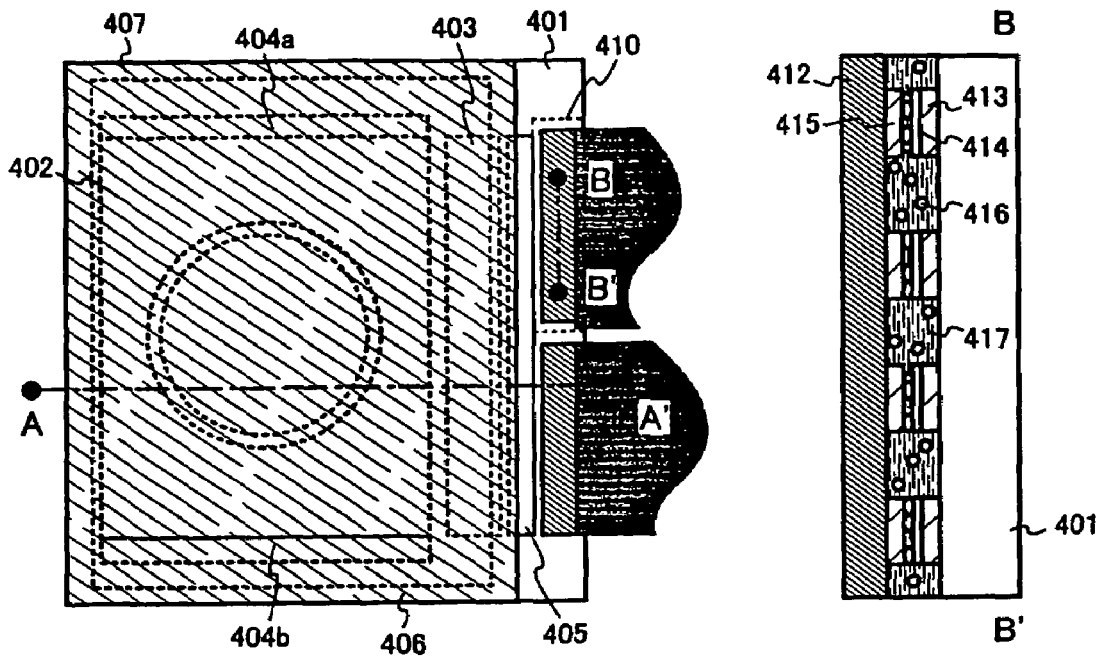
Fig. 15A
Fig. 15B
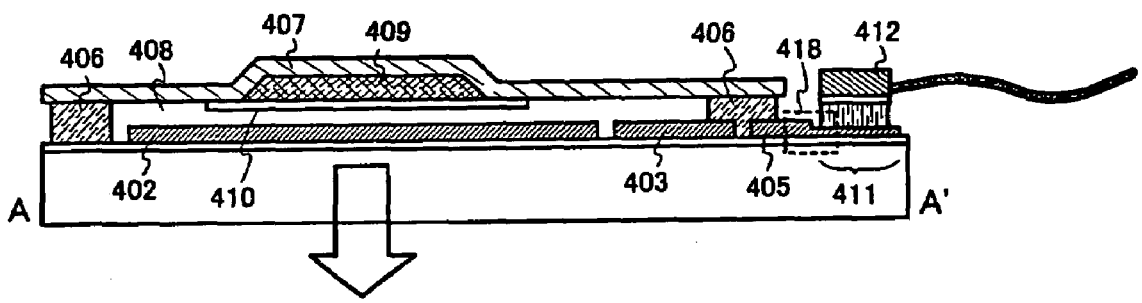
Fig. 15C
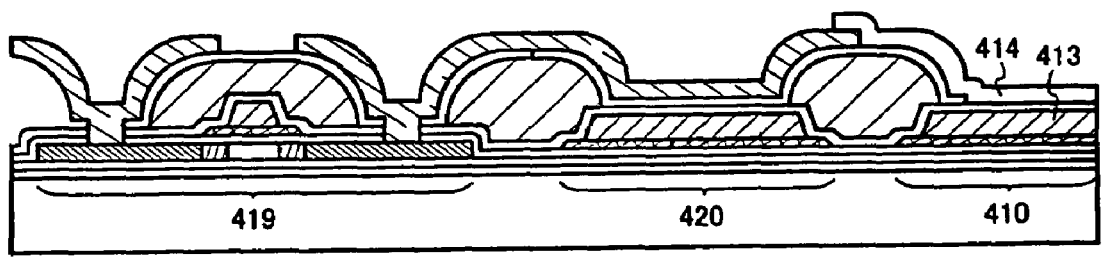
Fig. 15D

Characteristics of MOS-CV
( Si\SiO$_2$\RF-SP SiN\Li-dip\Al )

Characteristics of MOS-CV
(Si wafer\CVD SiN(100nm)\Al-Li)

SEMICONDUCTOR ELEMENT AND DISPLAY DEVICE USING THE SAME

BACKGROUND OF THE INVENTION

1. Field of the Invention

The present invention relates to a semiconductor element (typically, a transistor) and a manufacturing method thereof, and more specifically belongs to a technique of a display device using a thin film transistor as a device. That is, the present invention belongs to a technique concerning a display device represented by a liquid crystal display device, an electroluminescence display device, or the like, a technique concerning a sensor represented by a CMOS sensor or the like, and other techniques concerning various semiconductor devices in which a semiconductor integrated circuit is mounted.

2. Description of the Related Art

In recent years, the developments for a liquid crystal display device and an electroluminescence display device in which thin film transistors (TFTs) are integrated on a glass substrate have been progressed. These display devices each are one of semiconductor devices characterized in that thin film transistors are formed on glass substrate using a thin film formation technique and a liquid crystal element or an electroluminescence (hereinafter referred to as just an EL) element is formed on various circuits composed of the thin film transistors, so that a function as a display device is provided.

The circuits composed of the thin film transistors cause unevenness to some extent. Thus, when a liquid crystal element or an EL element is formed on the circuits, a leveling processing using an organic resin film or the like is generally conducted. Each pixel which is provided in a display portion of a display device has a pixel electrode therein. The pixel electrode is connected with the thin film transistor through a contact hole provided in the above-mentioned organic resin film for leveling.

However, the following facts are found by the studies of the present applicant. That is, when a resin film is used as an interlayer insulating film and a contact hole is formed using a dry etching technique, threshold voltages (Vth) of the completed thin film transistors are greatly varied. For example, data shown in FIGS. 4A and 4B are results examined with respect to a variation in threshold voltages of thin film transistors formed on an SOI substrate. In the drawings, a black circular mark indicates the case where a laminate structure of a silicon nitride film (SiN) and an acrylic film is used for the interlayer insulating film. In addition, an outline triangular mark in the drawings indicates the case where a laminate structure of a silicon nitride oxide film (SiNO) and a silicon oxynitride film (SiON) is used for the interlayer insulating film. In any case, the dry etching technique is used for the formation of the contact hole. Note that "SiNO" and "SiON" are separately used according to the meaning in which the former contains the amount of nitrogen larger than oxygen and the latter contains the amount of oxygen larger than nitrogen.

The data shown in FIGS. 4A and 4B are graphs obtained by evaluating a variation in threshold voltages using statistical processing. The ordinate indicates a channel length (carrier moving length) and the abscissa indicates a Vth variation. In recent years, "quartile deviation" has been known as statistical processing. The quartile deviation is a difference between a value of 25% and a value of 75% in a normal probability graph and has been noted as statistical processing which is not influenced by an abnormal value. The present applicant defines, based on the quartile deviation (which is also called 25 percentile deviation), a difference between a value of 16% and a value of 84% as 16 percentile deviation, and plots its value as "a Vth variation" in the abscissa. Note that the 16 percentile deviation corresponds to ±σ in a normal probability distribution. Thus, values, which are assumed as ±3σ by respectively multiplying by factors, are used for data plotting. When an acrylic film is used as an interlayer insulating film, as seen from the data, a variation in an n-channel TFT is about 4 times and a variation in a p-channel TFT is about 2 times those of the case not using the acrylic film. Thus, it is apparent that a variation is large in the case where the acrylic film is used. The present applicant estimates that a charge is captured in the acrylic film by plasma damage in dry etching, thereby providing a cause of varying a threshold voltage.

SUMMARY OF THE INVENTION

The present invention has been made in view of the above-mentioned problems, and has an object to provide a technique for producing a thin film transistor without varying its threshold voltage in manufacturing a display device using an organic resin film as an interlayer insulating film, and achieve the improvement of operating performance stability of the display device and an increase of a design margin in a circuit design. In addition, another object of the present invention is to achieve the improvement of image quality of the display device.

The present invention is characterized to solve the above problems by the following means. That is, it has such a feature that a photosensitive organic resin film (preferably, a photosensitive acrylic film, particularly, a positive type photosensitive acrylic film) is used as an organic resin film, a first opening is formed in the photosensitive organic resin film, a nitride insulating film covering the first opening is formed, a second opening is formed in the nitride insulating film using a photo resist or the like, and an upper electrode and a lower electrode which are located to sandwich the organic resin film are electrically connected with each other. Note that, when the positive type photosensitive acrylic film is used, it is generally colored with light brown. Thus, it is required that decolorization processing (bleaching processing) is conducted, so that it is made transparent with respect to visible light after the first opening is provided. In the decolorization processing, light used for exposure to the entire pattern after development (typically, ultraviolet light) is preferably irradiated.

The present invention will be described using FIGS. 1A and 1B. In FIG. 1A, reference numeral 101 denotes a substrate, 102 denotes a base film, 103 denotes a source region, 104 denotes a drain region, and 105 denotes a channel formation region. The source region, the drain region, and the channel formation region which are provided on the base film 102 are made from a semiconductor film. In addition, reference numeral 106 denotes a gate insulating film, 107 denotes a gate electrode, and 108 denotes a first passivation film. A known thin film transistor structure is described up to here. Various known materials can be used for materials of respective portions.

Next, a first characteristic of the thin film transistor of the present invention is that a photosensitive organic resin film, particularly, a positive type photosensitive acrylic film is used as an interlayer insulating film 109 on the first passivation film 108 that is an inorganic insulating film. A film thickness of the photosensitive organic resin film 109 is desirably selected from a range of 1 μm to 4 μm (preferably, 1.5 μm to 3 μm). A second characteristic is that a first opening portion (indicated by a diameter of φ1) 110 is provided in the photosensitive organic resin film 109 and a second passivation film 111 that is an inorganic insulating film is provided so as to cover the top surface of the photosensitive organic resin film 109 and the inner wall surface of the first opening portion 110. Further, a third characteristic is that the second passivation film 111 has a second opening portion (indicated by a diameter of $\phi2$) 112 in the bottom of the first opening portion 110 and an opening portion having the same diameter as the second opening portion 112 is formed in the first passivation film 108 and the gate insulating film 106. In other words, it has such a feature that the second opening portion is provided in a laminate including the gate insulating film 106, the first passivation film 108, and the second passivation film 111 inside the first opening portion 110. In addition, a source electrode 113 is connected with the source region 103 through the first opening portion 110 and the second opening portion 112. A drain electrode 114 is similarly connected with the drain region 104.

Note that a silicon nitride film, a silicon nitride oxide film, a silicon oxynitride film, an aluminum nitride film, an aluminum nitric oxide film, or an aluminum oxynitride film can be used for the first passivation film 108 and the second passivation film 111. In addition, a laminate film including these films in at least a portion thereof can be used. It is desirable that the diameter of $\phi1$ is set to 2 μm to 10 μm (preferably, 3 μm to 5 μm) and the diameter of $\phi2$ is set to 1 μm to 5 μm (preferably, 2 μm to 3 μm). Note that, because a design rule of the diameters of the opening portions is changed according to precision of a photolithography process, it is unnecessary to limit the present invention to these numerical ranges. In other words, in any case, it is preferable that a relationship of $\phi1>\phi2$ is satisfied.

Here, an enlarged view of a portion of a region 115 surrounded by a dotted line is shown in FIG. 1B. In FIG. 1B, a portion of the first opening portion 110 and a portion of the second opening portion 112 are shown. With respect to the first opening portion 110, its inner wall surface is a gradual curved surface and has a continuously changed curvature radius. For example, when three points of curvature radii of R1, R2, and R3 are noted in order, a relationship among the respective curvature radii becomes R1<R2<R3 and these numerical values each are within 3 μm to 30 μm (typically, 10 μm to 15 μm). In addition, an angle (contact angle θ) formed by the photosensitive organic resin film 109 and the first passivation film 108 in the bottom of the first opening portion 110 is set within a range of 30°<θ<65° (typically, 40°<θ<50°).

In this time, in a portion indicated by reference numeral 116 in FIG. 1B, the first passivation film 108 and the second passivation film 111 are in close contact with each other, so that a state in which the photosensitive organic resin film 109 is sealed is obtained. In this time, it is desirable that a length of the close contact region, that is, a length of the region in which the first passivation film 108 and the second passivation film 111 are in contact with each other is 0.3 μm to 3 μm (preferably, 1 μm to 2 μm). Basically, it is desirable that the radius of the first opening portion 110 is larger than that of the second opening portion 112 by 0.3 μm to 3 μm.

There is the case where the photosensitive organic resin film used in the present invention (here, a positive type photosensitive acrylic film) produces a gas component during and after the formation of a thin film transistor Thus, it is very important to seal with organic insulating films each having a sufficient close contact property (particularly, a silicon nitride film or a silicon nitride oxide film which has a high barrier property is suitable) in view of preventing the deterioration of a liquid crystal element and an EL element which are formed on the thin film transistor.

Next, a method of manufacturing the thin film transistor having the structure shown in FIG. 1A will be described using FIGS. 2A to 2E. First, it will be described using FIG. 2A. The base film 102 is formed on the substrate 101 and an island-like semiconductor film which is processed by etching is formed thereon. Then, the gate insulating film 106 is formed on the entire surface, the gate electrode 107 is formed, and the source region 103 and the drain region 104 are formed in self-alignment using the gate electrode 107 as a mask. At this time, the channel formation region 105 is simultaneously determined. After the formation of the source region 103 and the drain region 104, the source region 103 and the drain region 104 are activated by heat treatment. Further, the first passivation film 108 is formed and then hydrogenation processing is conducted by heat treatment. The manufacturing method until now is preferably conducted using a known technique. Various known materials can be used as materials composing the thin film transistor. Next, a photosensitive organic resin film, here, a positive type photosensitive acrylic film is formed as the interlayer insulating film 109.

Next, it will be described using FIG. 2B. After the formation of the photosensitive organic resin film 109, exposure processing using a photolithography process is conducted, so that the photosensitive organic resin film 109 is etched to form the first opening portion 110. This is a possible technique because the photosensitive organic resin film is used. In addition, because etching itself is wet etching using a developer, an effect in which a problem such as the above plasma damage is not caused is obtained. After etching using a developer, decolorization processing is conducted for the photosensitive organic resin film 109. The decolorization processing is preferably conducted by irradiating more intense light than light used for exposure to the entire pattern. Note that, it is necessary to conduct decolorization processing immediately after the exposure, that is, before baking treatment. This is because, after baking, cross-linking of the photosensitive organic resin film 109 is completed, so that decolorization by light irradiation is impossible.

Also, the first opening portion 110 becomes a cross sectional shape as shown in FIG. 1B and has a very gradually curved inner wall surface. Thus, the coverage of an electrode which is formed later becomes extremely satisfactory. Note that, in a baking process after etching, it is desirable that heating is conducted in an inert atmosphere (nitrogen atmosphere, noble gas atmosphere, or hydrogen atmosphere) in order to prevent absorption or adsorption of moisture and oxygen into a resin. In this time, it is desirable that an inert atmosphere is definitely kept from a temperature rise to a temperature fall to suppress the amount of adsorption (or absorption) of moisture and oxygen to 10 ppm or less (preferably, 1 ppm or less).

Next, it will be described using FIG. 2C. After the formation of the first opening portion 110, the second passivation film 111 is formed so as to cover the top surface of the photosensitive organic resin film 109 and the inner wall surface of the first opening portion 110. The same material as the first passivation film 108 may be used for the second passivation film 111. It is preferable that a sputtering method using a high frequency discharge is used for the formation of the second passivation film 111. With a condition, it is preferable that a silicon target is used and a nitrogen gas is used as a sputtering gas. A pressure is preferably set as appropriate. It is preferable that a pressure is 0.5 Pa to 1.0 Pa, discharge power is 2.5 kW to 3.5 kW, and a film formation temperature is within a room temperature (25° C.) to 250° C. After the formation of the second passivation film 111, a photo resist 201 is formed. The photo resist 201 is a mask for forming the second opening portion 112 in the second passivation film 111.

Next, it will be described using FIG. 2D. After the formation of the photo resist 201, etching processing is conducted to etch the second passivation film 111, the first passivation film 108, and the gate insulating film 106 in order, thereby forming the second opening portion 112. In this time, the etching processing may be dry etching processing or wet etching processing. In order that a preferable shape of the second opening portion 112 is obtained, dry etching processing is preferable. According to the present invention, even when dry etching processing is conducted here; there is no case where the photosensitive organic resin film 109 is directly exposed to plasma. Thus, a problem in which plasma damage is accumulated is not caused. Therefore, according to one of characteristics of the present invention, while the inner wail surface of one opening portion provided in the photosensitive organic resin film are protected by a nitride insulating film such as a silicon nitride film, another opening portion having a smaller diameter is provided in the bottom of the opening portion.

Also, when the second opening portion 112 is formed by dry etching processing, the gate insulating film 106 and the first passivation film 108 are etched. In this etching, productivity can be improved according to a combination of inorganic insulating films. In other words, when a silicon nitride film is used as the first passivation film 108 and a silicon oxynitride film is used as the gate insulating film 106, the gate insulating film 106 can serve as an etching stopper in etching the first passivation film 108 and the source region (silicon film) 103 can serve as an etching stopper in etching the gate insulating film 106.

For example, the case where a silicon oxynitride film is used as the gate insulating film 106 and a silicon nitride film is used as the first passivation film 108 is considered. The silicon nitride film serving as the first passivation film 108 can be etched using a carbon tetrafluoride ($CF_4$) gas, a helium (He) gas, and an oxygen ($O_2$) gas. The silicon film is also etched by these gases. However, because the silicon oxynitride film serving as the gate insulating film 106 of a base film functions as an etching stopper, there is no case where the silicon film serving as the source region 103 is lost. In addition, the gate insulating film (here, a silicon oxynitride film) 106 can be etched by using a trifluoromethane ($CHF_3$) gas and the silicon film is hardly etched. Thus, the source region 103 can serve as an etching stopper.

Next, it will be described using FIG. 2E. After the formation of the second opening portion 112, a metallic film is formed thereon and patterned by etching to form the source electrode 113 and the drain electrode 114. In order to form these electrodes, a titanium film, a titanium nitride film, a tungsten film (including an alloy), an aluminum film (including an alloy), or a laminate film of those is preferably used.

Therefore, the thin film transistor having the structure described using FIGS. 1A and 1B can be obtained. The thus obtained thin film transistor has a photosensitive organic resin film, and the photosensitive organic resin film also serves as a leveling film. In addition, the photosensitive organic resin film is sealed with the nitride-insulating film (typically, a silicon nitride film or a silicon nitride oxide film), so that a problem resulting from degassing is not also caused.

Here, a reason why a positive type photosensitive acrylic film is particularly preferable as the photosensitive organic resin film 109 will be described below.

First, a photograph shown in FIG. 3A is a cross sectional SEM (scanning electron microscope) photograph in a state in which a non-photosensitive acrylic film (film thickness: about 1.3 μm) is processed by dry etching to conduct patterning and FIG. 3B is its schematic view. When the non-photosensitive acrylic film is processed by dry etching as in a conventional case, a curved surface is hardly formed in the top portion of pattern, so that the top end portion has substantially no curvature radius (R). In addition, in the bottom portion of pattern, a taper angle (contact angle) becomes about 63°. However, a curved surface is not observed even in the bottom end portion.

Next, a photograph shown in FIG. 5A is a cross sectional SEM photograph in a state in which a positive type photosensitive acrylic film (film thickness: about 2.0 μm) is processed by exposure and development to conduct patterning and FIG. 5B is its schematic view. With respect to a cross sectional shape of the positive type photosensitive acrylic film, it has a very gradually curved surface after etching processing using a developer and a curvature radius (R) is continuously changed. In addition, a small contact angle of about 32° to 33° is obtained. In other words, the film has the shape shown in FIG. 1B itself. Thus, when the thin film transistor and the display device according to the present invention are manufactured, it can be said that such a shape is a very useful shape. Of course, a contact angle value is changed according to an etching condition, a film thickness, and the like. However, 30°<θ<65° is preferably satisfied as described above.

Next, a photograph shown in FIG. 6A is a cross sectional SEM photograph in a state in which a negative type photosensitive acrylic film (film thickness: about 1.4 μm) is processed by exposure and development to conduct patterning and FIG. 6B is its schematic view. With respect to a cross sectional shape of the negative type photosensitive acrylic film, a gradual S-shaped curved surface is formed after etching processing using a developer and the top end portion of pattern is curved at a curvature radius (R). In addition, a contact angle value of about 47° is obtained. In this case, a length of a tail (lower slope) portion indicated by W in FIG. 6B becomes a problem. In particular, with respect to a contact hole (opening portion) for which microfabrication is required, when the tail portion becomes longer, there is a possibility that a state in which a lower layer electrode or a wiring is not exposed in the contact hole is caused, so that a disconnection resulting from a poor contact is concerned. Note that, when the length (W) of the tail portion is 1 μm or less (preferably, a length shorter than the radius of a contact hole), a possibility of such a disconnection becomes lower.

Next, a photograph shown in FIG. 7A is a cross sectional SEM photograph in a state in which a positive type photosensitive polyimide film (film thickness: about 1.5 μm) is processed by exposure and development to conduct patterning and FIG. 7B is its schematic view. With respect to a cross sectional shape of the positive type photosensitive polyimide film, it has a slight tail portion (indicated by the length W) and a curved top end portion after etching processing using a developer. However, its curvature radius (R) is small.

When the above cross sectional shapes are observed, the following can be considered. When a metallic film which becomes an electrode or a wiring is formed after the formation of the contact hole (opening portion), a sputtering method, an evaporation method, a CVD method, or the like is used. It has been known that material molecules composing the thin film transistor move toward a stable cite on a surface when they are deposited on a surface to be formed and are easy to gather into a portion having a shape with an acute angle (shape which becomes a convex portion), such as the top end portion of the contact hole. This tendency is remarkable in particularly an evaporation method. Therefore, when the cross sectional shape of the opening portion is the shape as shown in FIG. 3A, the material molecules gather to the edge of the opening portion, so that only its portion locally becomes thicker and an eaves-shaped convex portion is formed. This becomes a cause of a defect such as a disconnection (step disconnection) later and it is not preferable. Accordingly, it can be said that the non-photosensitive acrylic film shown in FIG. 3A and the positive type photosensitive polyimide film shown in FIG. 7A are disadvantageous materials in view of coverage.

Also, as shown in FIGS. 6A and 7A above, with respect to the shape in which the tail portion is formed in the bottom end portion of the contact hole, the tail portion covers the bottom surface of the contact hole in some cases and there is a possibility that a poor contact is caused. Thus, it can be said that such films are disadvantageous materials in view of contact. Of course, when the length of the tail portion is 1 μm or less (preferably, a length shorter than the radius of the contact hole), there is no problem.

When the present invention is carried out in view of the above points, it can be said that the positive type photosensitive acrylic film with the shape shown in FIG. 5A is most suitable. In other words, when the positive type photosensitive acrylic film is used, it has a very gradual curved surface in the top end portion of the contact hole. Thus, there is completely no problem with respect to coverage. In addition, in the bottom end portion of the contact hole, the bottom surface of the contact hole is reliably determined with a contact angle satisfying $30° < \theta < 65°$ without forming the tail portion. Thus, a problem of a poor contact is not also caused. From the above reasons, the present applicant considers that a positive type photosensitive acrylic film is a most preferable material to an interlayer insulating film made of particularly an organic resin when the present invention is carried out.

As described above, when the thin film transistor using the organic resin film as the interlayer insulating film is manufactured, the photosensitive organic resin film is used as the interlayer insulating film and the contact structure shown in FIGS. 1A and 1B is employed. Thus, the thin film transistor can be manufactured without varying the threshold voltage. Therefore, with respect to not only the thin film transistor but also the display device using it, the improvement of stability of operating performances and the increase of design margin in a circuit design can be achieved.

BRIEF DESCRIPTION OF THE DRAWINGS

In the accompanying drawings:

FIGS. 9A to 9D show a pixel structure of a light emitting device;

FIGS. 10A and 10B show cross sectional structures of the light emitting device;

FIGS. 13A to 13D show a pixel structure of a liquid crystal display device;

FIGS. 15A to 15D show an outline structure of the light emitting device;

DETAILED DESCRIPTION OF THE PREFERRED EMBODIMENTS

Embodiment 1

Figure 1A:
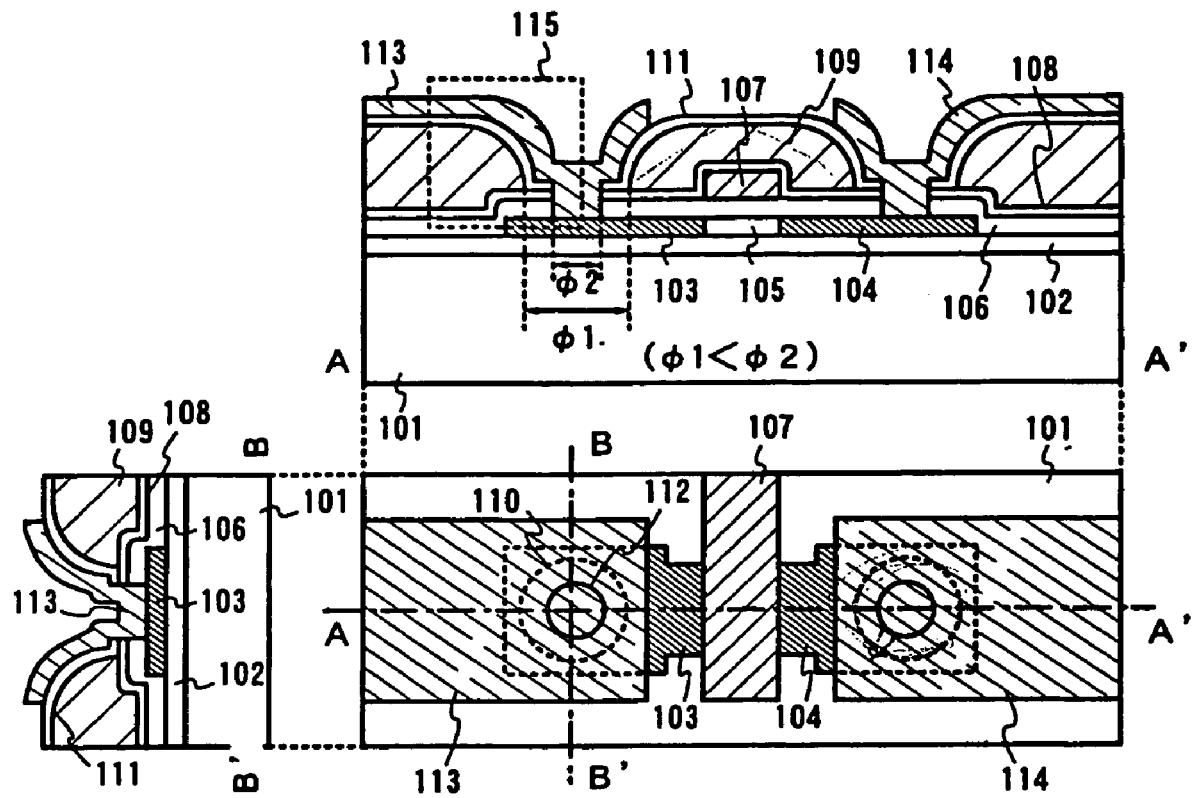
FIGS. 1A and 1B show a structure of a thin film transistor.
Figure 1B:
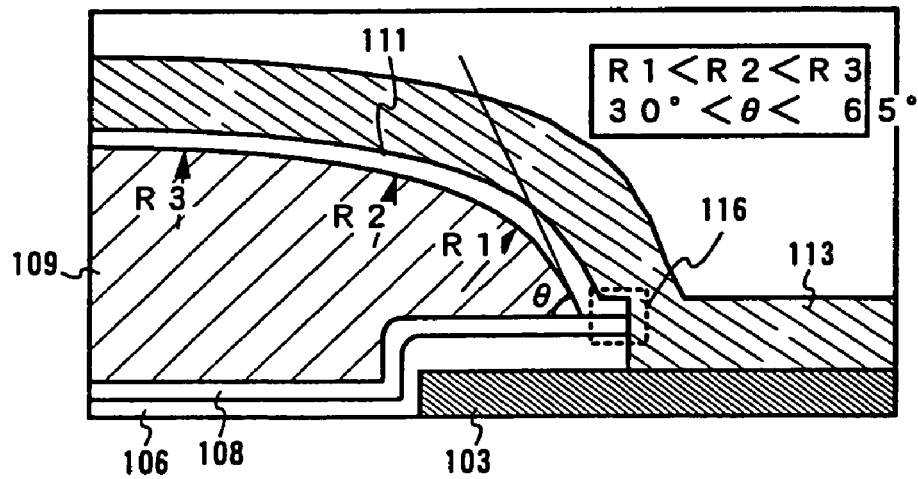
Figure 2A:
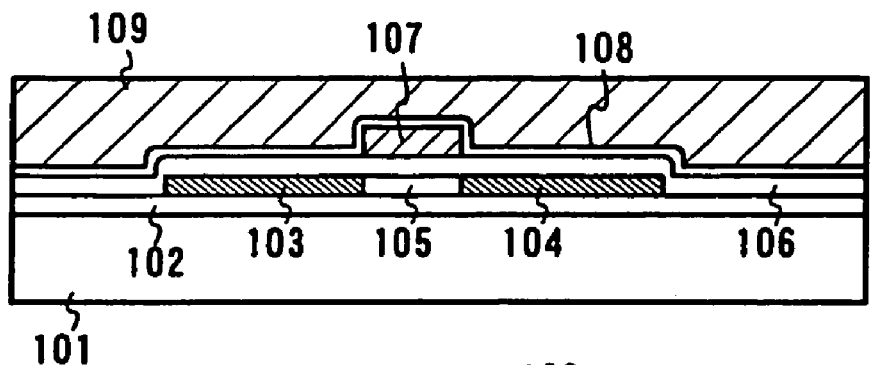
FIGS. 2A to 2E show a process of manufacturing the thin film transistor.
Figure 2B:
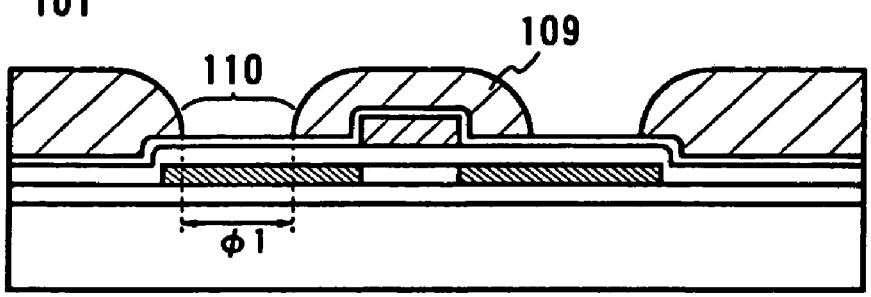
Figure 2C:
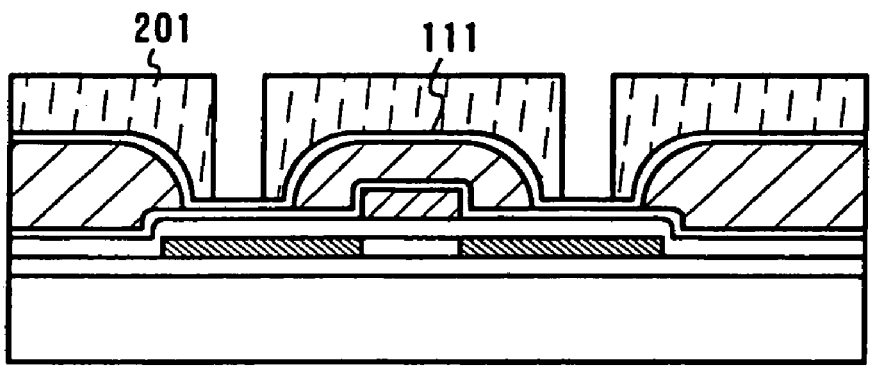
Figure 2D:
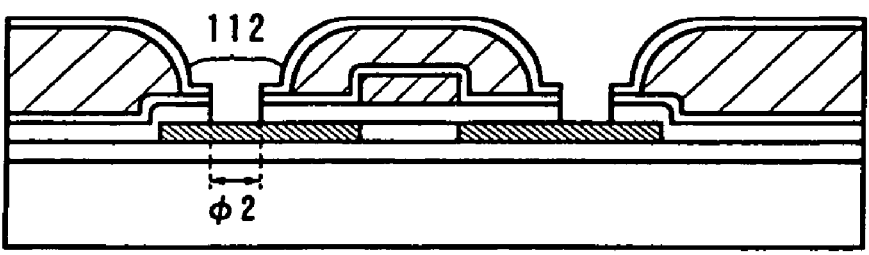
Figure 2E:
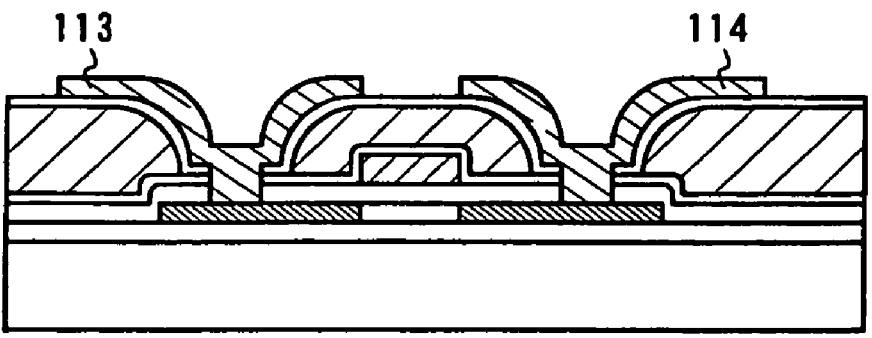
Figure 3A:
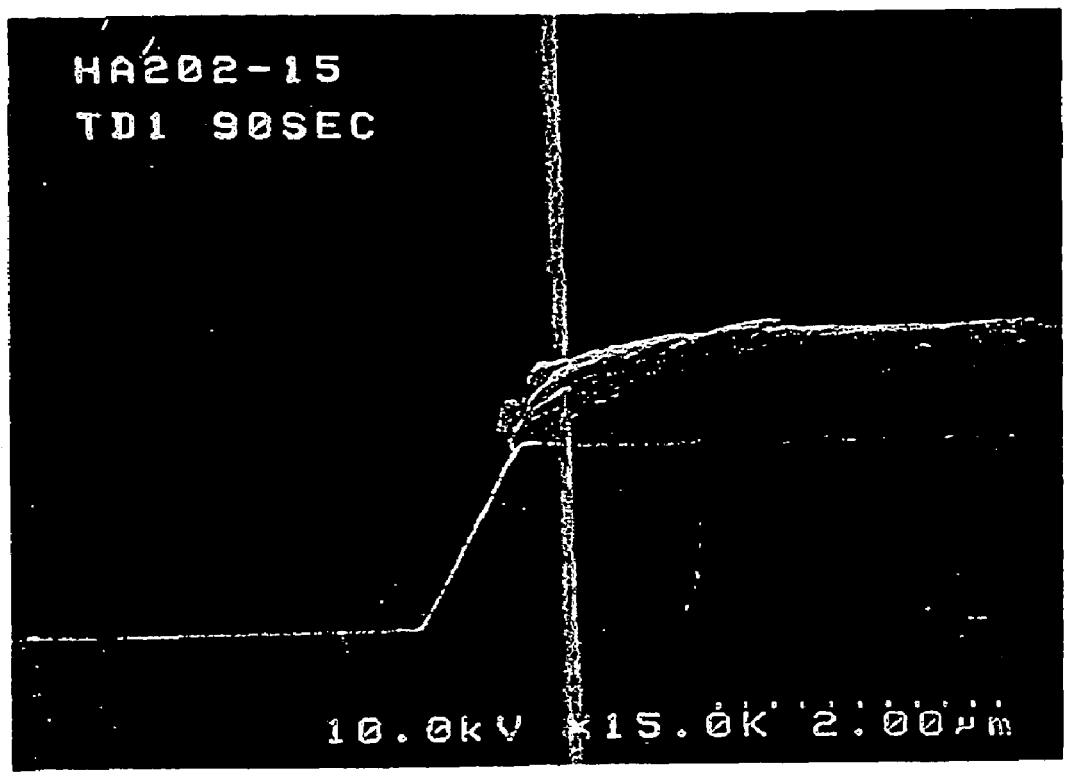
FIGS. 3A and 3B are an SEM photograph and a schematic view which show a cross sectional structure of an organic resin film.
Figure 3B:
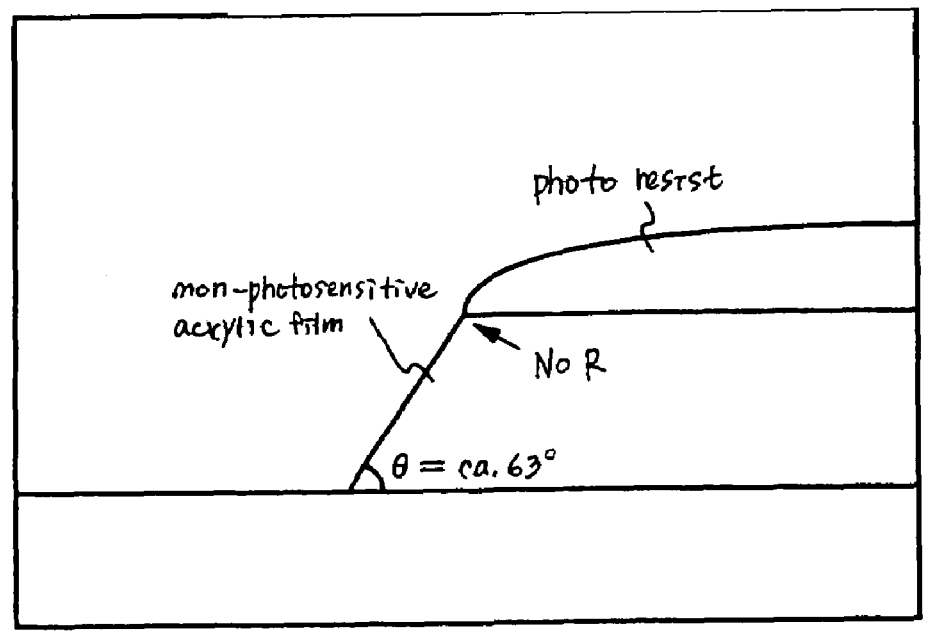
Figure 4A:
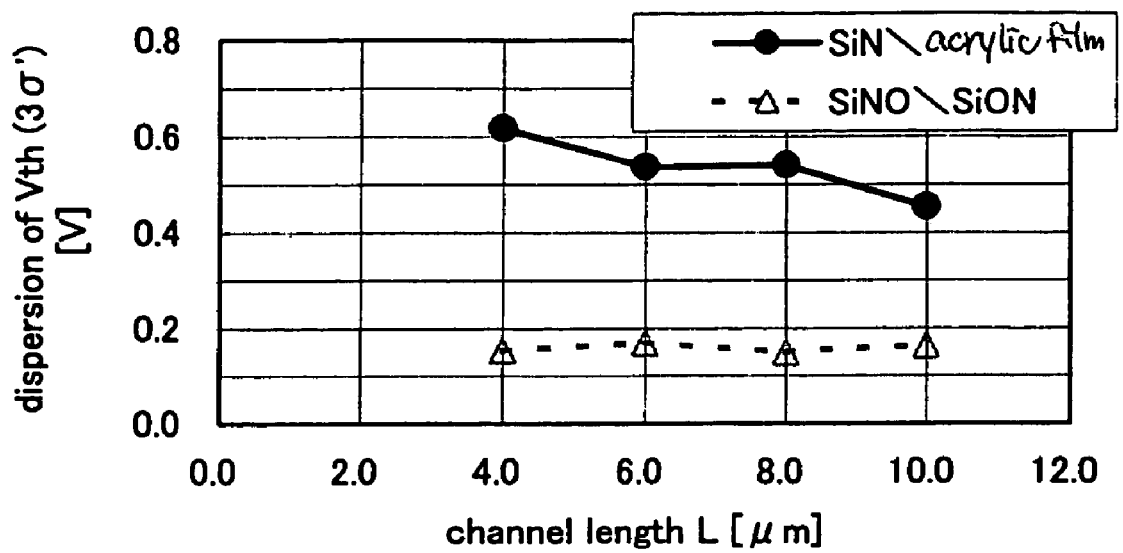
FIGS. 4A and 4B show dispersions in threshold voltages.
Figure 4B:
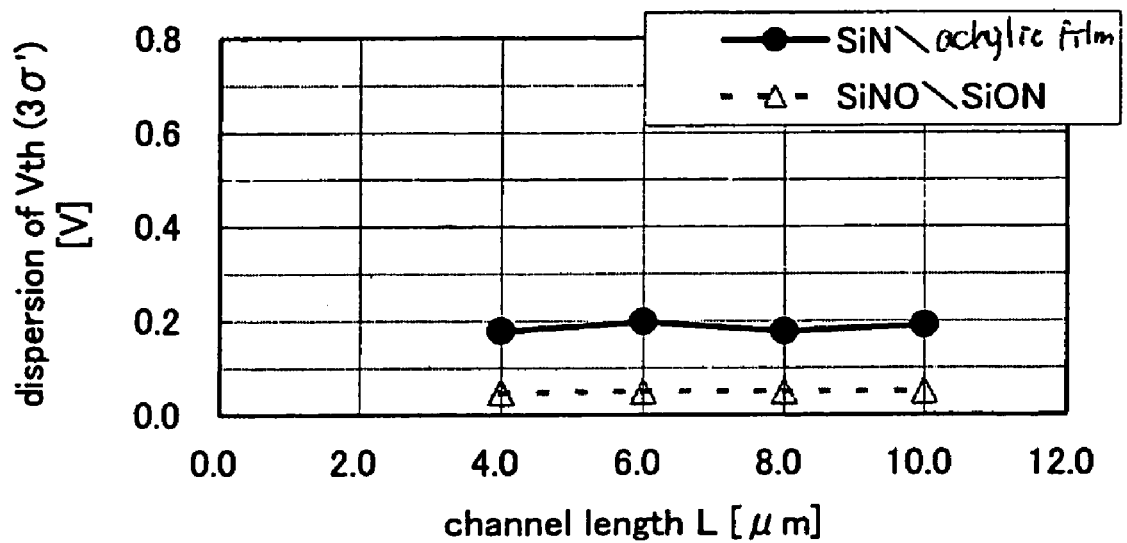
Figure 5A:
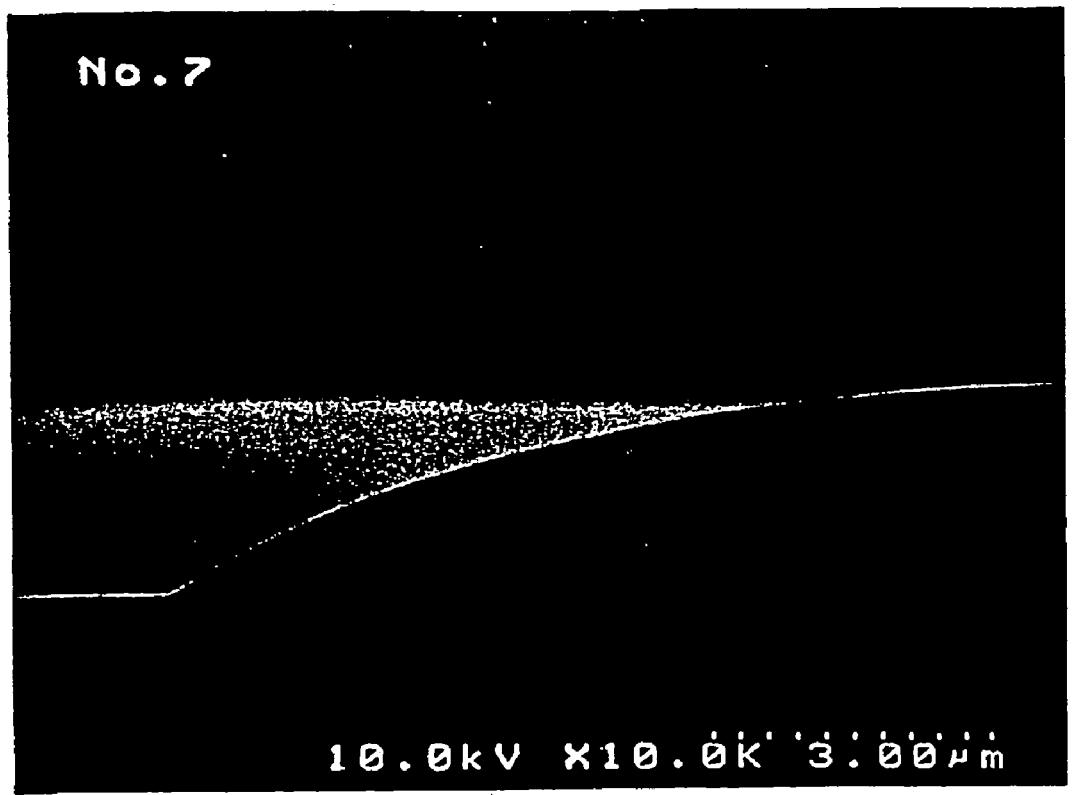
FIGS. 5A and 5B are an SEM photograph and a schematic view which show a cross sectional structure of an organic resin film.
Figure 5B:
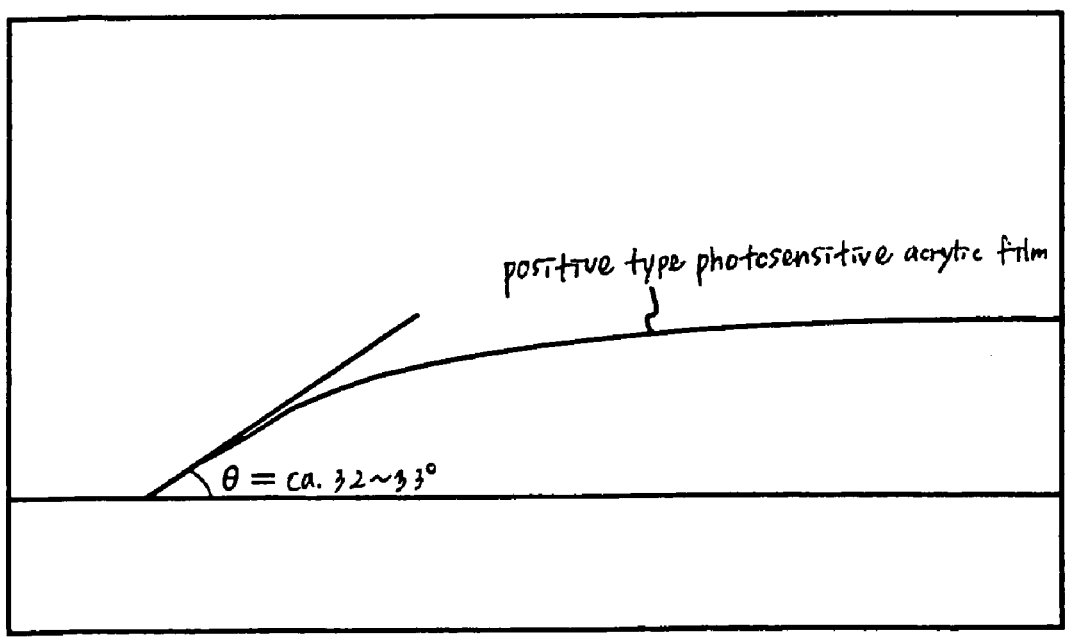

In this embodiment, an example in which the formation position of the first opening portion 110 is changed in FIGS. 1A and 1B will be described using FIGS. 8A and 8B. Note that FIGS. 8A and 8B each show a cross sectional structure immediately after the formation of the second opening portion. In addition, the reference symbols used in FIGS. 1A and 1B are referred to if necessary.

Figure 8A:
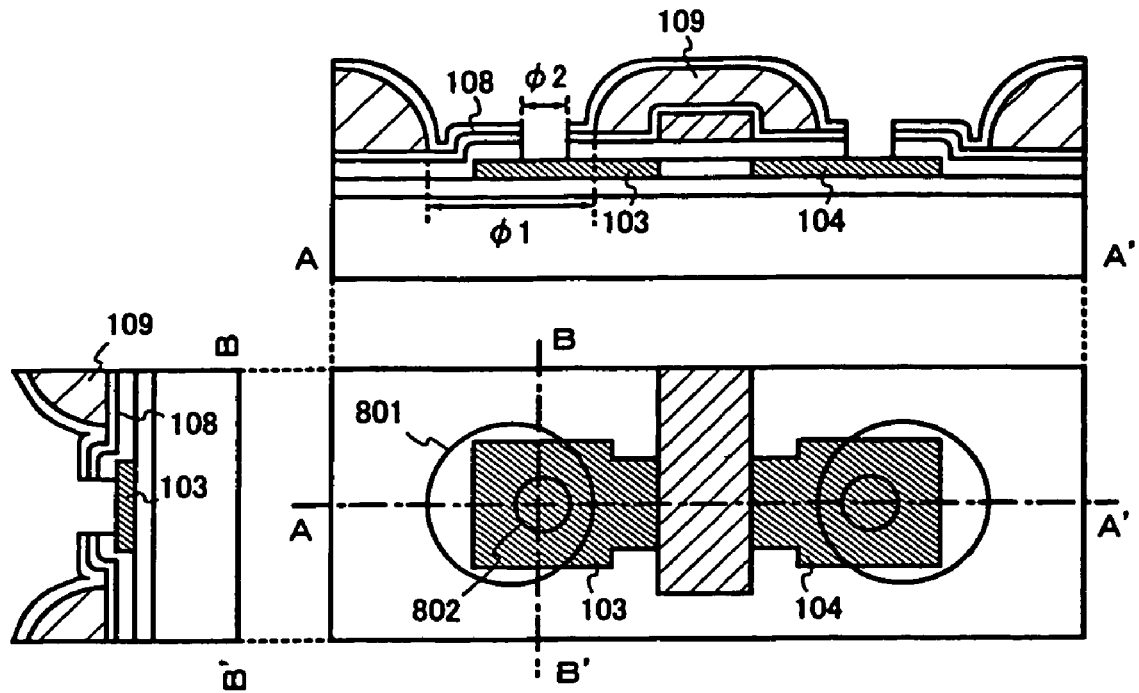
FIGS. 8A and 8B show a structure of a thin film transistor.
Figure 8B:
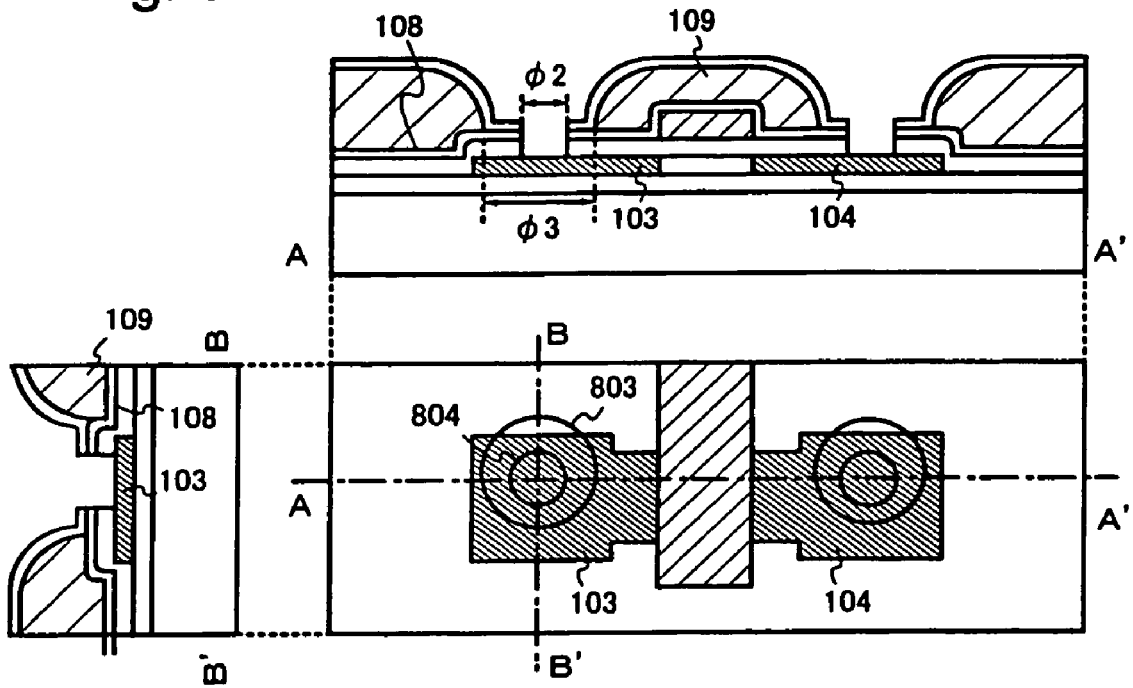

In FIG. 8A, reference numeral 801 denotes a first opening portion having a diameter of φ1 and 802 denotes a second opening portion having a diameter of φ2. A characteristic in FIG. 8A is that the first opening portion 801 is provided to protrude from the end portion of the source region 103. The photosensitive organic resin film 109 can be formed in a position as indicated in this embodiment because the first passivation film 108 becomes an etching stopper, thereby stopping the progress of etching. In addition, in FIG. 8B, reference numeral 803 denotes a first opening portion having a diameter of φ3 and 804 denotes a second opening portion having a diameter of φ2. A characteristic in FIG. 8B is also that the first opening portion 803 is provided to protrude from the side end portion of the source region 103. Even in this case, with respect to the photosensitive organic resin film 109, the first passivation film 108 becomes an etching stopper, thereby stopping the progress of etching.

As described above, the inorganic insulating film which can become an etching stopper is located under the photosensitive organic resin film used as the interlayer insulating film. Thus, even when the diameter of the first opening portion is increased, there is no problem, so that it is very useful because a design margin in the formation of the contact hole can be widened.

Embodiment 2

In this embodiment, an example in which the present invention is applied to a light emitting device such as an EL display device will be described. FIG. 9A is a plan view of a pixel of the light emitting element (note that a state up to the formation of a pixel electrode is indicated), FIG. 9B is a circuit diagram thereof, and FIGS. 9C and 9D each are a cross sectional view along a line A-A' or B-B'.

As shown in FIGS. 9A and 9B, a display portion of the light emitting device includes a plurality of pixels which are surrounded by gate wirings 951, data wirings 952, and power source wirings (wirings for supplying a constant voltage or a constant current) 953 and arranged in matrix. In each of the pixels, a TFT 954 serving as a switching element (hereinafter referred to as a switching TFT), a TFT 955 serving as means for supplying a current or a voltage for producing light emission of an EL element (hereinafter referred to as a driver TWT), a capacitor portion 956, and an EL element 957 are provided. Although not shown here, the EL element 957 can be formed by providing a light emitting layer over a pixel electrode 958.

Note that, in this embodiment, an n-channel TFT having a multi-gate structure is used as the switching TFT 954 and a p-channel TFT is used as the driver TFT 955. However, it is not required that the pixel structure of the light emitting element is limited to this. Thus, the present invention can be applied to various known structures.

In the cross sectional view of FIG. 9C, the n-channel TFT 954 and the capacitor portion 956 are shown. Reference numeral 901 denotes a substrate, and a glass substrate, a ceramic substrate, a quartz substrate, a silicon substrate, or a plastic substrate (including a plastic film) can be used. In addition, reference numeral 902 denotes a silicon nitride oxide film, 903 denotes a silicon oxynitride film, and they are laminated to serve as base films. Of course, it is not required that the present invention is limited to these materials. Further, an active layer of the n-channel TFT 954 is provided on the silicon oxynitride film 903. The active layer has a source region 904, a drain region 905, LDD regions 906a to 906d, and channel formation regions 907a and 907b. In other words, it has two channel formation regions and four LDD regions between the source region 904 and the drain region 905.

Also, the active layer of the n-channel TFT 954 is covered with a gate insulating film 908, and a gate electrode (gate electrode layers 909a and 909b) and another gate electrode (gate electrode layers 910a and 910b) are provided thereon. In this embodiment, a silicon oxynitride film is used as the gate insulating film 908. When the above nitride insulating film such as an aluminum nitride film having a high relative dielectric constant is used, an occupying area of an element can be reduced. Thus, it is effective for the improvement of the scale of integration.

Also, a tantalum nitride film is used for the gate electrode layers 909a and 910a and a tungsten film is used for the gate electrode layers 909b and 910b. With respect to these metallic films, a selection ratio is high. Thus, the structure as shown in FIG. 9B can be obtained by selecting an etching condition. The etching condition is preferably referred to JP 2001-313397 A according to the present applicant.

Also, a silicon nitride film or a silicon nitride oxide film is provided as a first passivation film 911 covering the gate electrodes, and a photosensitive organic resin film 912 (in this embodiment, a positive type photosensitive acrylic film is used) is provided thereon. Further, a second passivation film 913 is provided on the photosensitive organic resin film 912 so as to cover a first opening portion (see FIG. 1A). A second opening portion (see FIG. 1A) is provided to the bottom of the first opening portion. In this embodiment, a silicon nitride film or a silicon nitride oxide film is used as the second passivation film 913. Of course, another nitride insulating film such as an aluminum nitride film or an aluminum nitric oxide film can be also used.

Also, the data wiring 952 is connected with the source wiring 904 through the second opening portion, and a connection wiring 915 is connected with the drain region 905 through the second opening portion. The connection wiring 915 is a wiring connected to a gate electrode of the driver TFT 955. A structure in which a wiring containing mainly low resistance metal such as aluminum or copper is sandwiched by other metallic films or an alloy film of these metals is preferably used for the data wiring 952 and the connection wiring 915.

Also, reference numeral 916 denotes a source region of the driver TFT 955, with which the power source wiring 953 is connected. In a contact portion for this connection, the first opening portion and the second opening portion are formed by carrying out the present invention. In addition, the power source wiring 953 is opposite to a gate wiring 917 of the driver TFT 955 through the first passivation film 911 and the second passivation film 913, so that a storage capacitor 956a is formed. Further, the gate wiring 917 is opposite to a semiconductor film 918 through the gate insulating film 908 so that a storage capacitor 956b is formed. Because the power source wiring 953 is connected with a semiconductor layer 919, a charge is supplied therefrom, so that the semiconductor film 918 serves as an electrode. Thus, the capacitor portion 956 becomes a structure in which the storage capacitors 956a and 956b are connected in parallel, thereby obtaining a large capacity with a very small area. Furthermore, with respect to particularly the storage capacitor 956a, a silicon nitride film having a high relative dielectric constant is used for dielectric, so that a large capacity can be ensured. Because the dielectric of the storage capacity 956a is composed of a laminate structure of the first passivation film 911 and the second passivation film 913, a probability of occurrence of a pinhole is extremely low. Thus, a capacitor with high reliability can be formed.

When the present invention is carried out, the number of masks used in a photolithography process is increased to form the second opening portion as compared with a conventional case. However, when the increase in the number of masks is advantageously used, a new storage capacitor can be formed as described in this embodiment. Such a point is also one of important characteristics of the present invention. The characteristic of the present invention more than compensates for a demerit resulting from the increase in the number of masks, so that it greatly contributes to industrial progress. For example, when high definition image display is obtained, it is required that a relative occupying area of the storage capacitor to an area of each pixel is reduced in a display portion to improve an aperture ratio. Therefore, it is extremely useful to increase a storage capacity.

Also, in FIG. 9D, reference numeral 920 denotes a drain region of the driver TFT 955, which is connected with a drain wiring 921. The drain wiring 921 is connected with a pixel electrode 958 to compose a pixel. In this embodiment, an oxide conductive film which is transparent with respect to visible light (typically, an ITO film) is used as the pixel electrode 958. However, the present invention is not limited to such a film.

An example after an EL element is actually formed in the light emitting device having the above pixel structure is shown in FIGS. 10A and 10B. FIG. 10A is a cross sectional view corresponding to the cross section shown in FIG. 9D and shows a state in which the EL element 957 is formed on the pixel electrode 958. Note that, when the structure shown in FIG. 10A is used, the pixel electrode 958 corresponds of the anode of the EL element 957. In addition, in this specification, an EL element indicates an element in which an EL layer is provided between a cathode and an anode and a voltage is applied to the EL layer or a current is injected thereto to emit light.

Figure 6A:
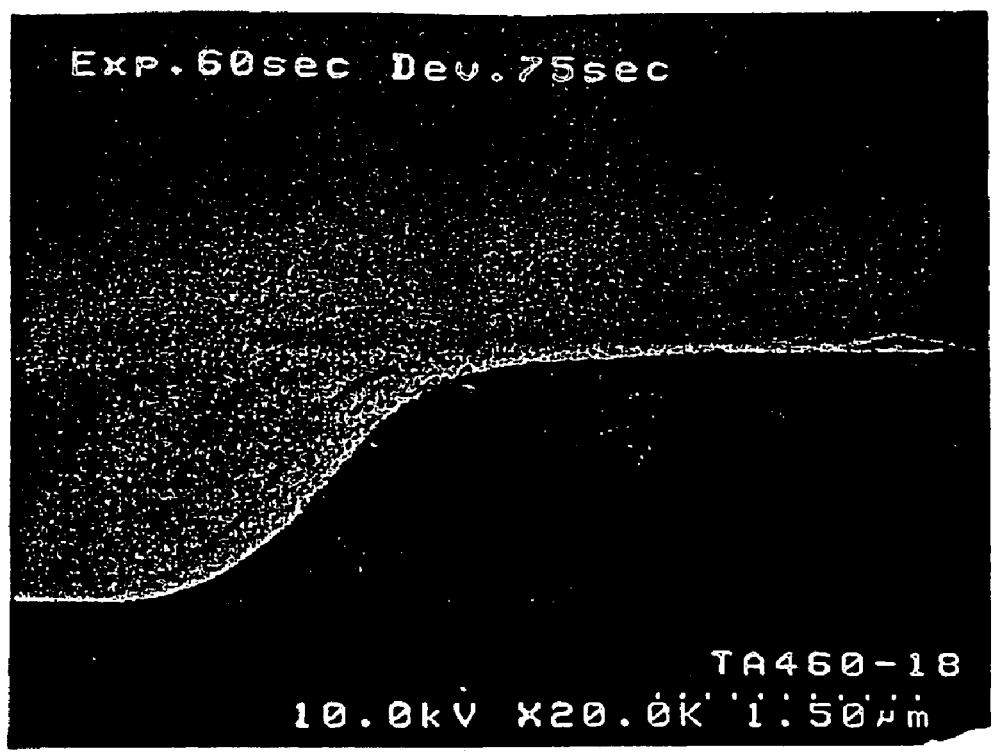
FIGS. 6A and 6B are an SEM photograph and a schematic view which show a cross sectional structure of an organic resin film.
Figure 6B:
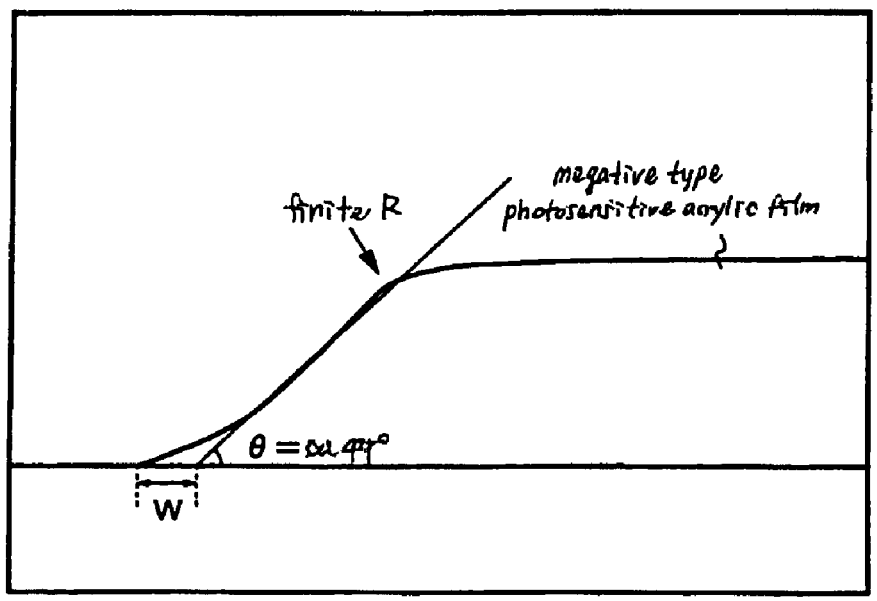
Figure 7A:
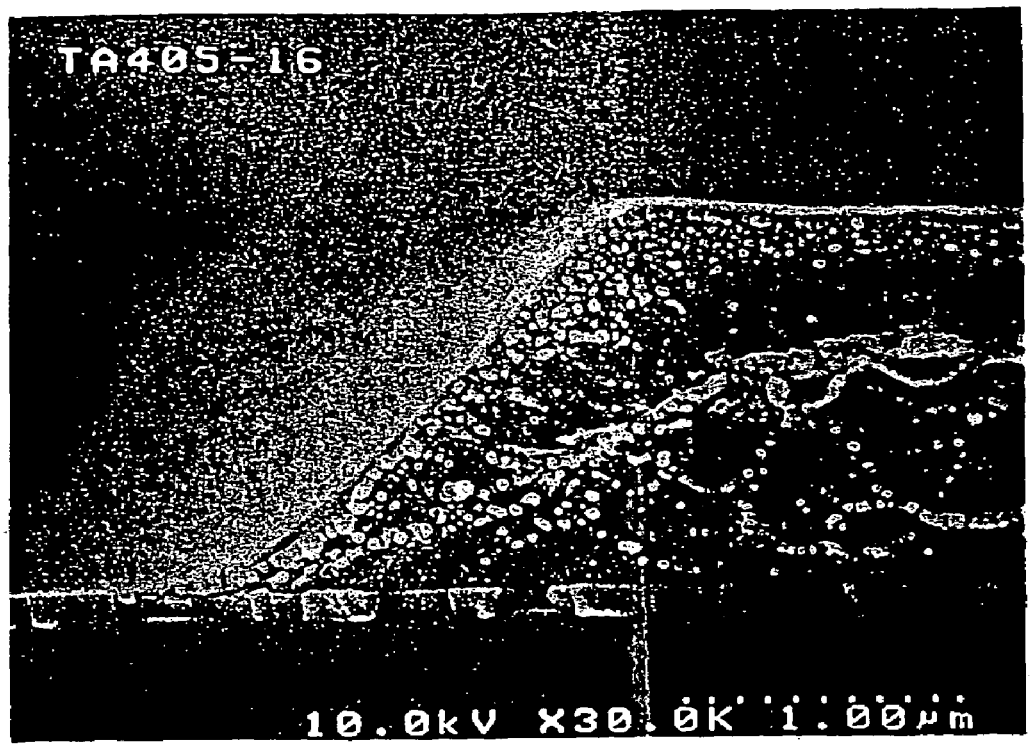
FIGS. 7A and 7B are an SEM photograph and a schematic view which show a cross sectional structure of an organic resin film.
Figure 7B:
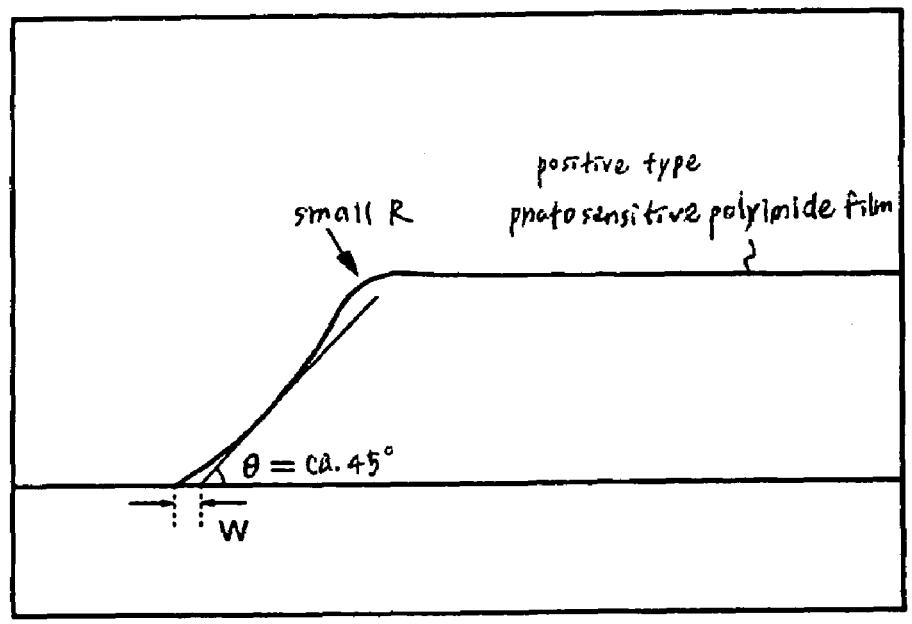

The end portion of the pixel electrode 958 is covered with a photosensitive organic resin film 961. The photosensitive organic resin film 961 is provided in a grid shape so as to frame each pixel or provided in a stripe shape in row unit or column unit. In any case, when it is formed on the contact hole, a concave portion can be efficiently embedded and the entire surface can be also leveled. Note that, in this embodiment, the same material as the photosensitive organic resin film (first photosensitive organic resin film) 912 used as the interlayer insulating film described above (in this embodiment, the positive type photosensitive acrylic film) is used for the photosensitive organic resin film (second photosensitive organic resin film) 961. Thus, manufacturing facilities can be minimized. In addition, although not shown, the negative type photosensitive acrylic film which becomes an S-shaped cross section as shown in FIGS. 6A and 6B may be used. Of course, in this time, it is desirable that a curvature radius in a top end portion and a bottom end portion of the opening portion is set to 3 μm to 30 μm (typically, 10 μm to 15 μm). In addition, in this case, when a length of the tail portion indicted by W is not minimized, it is not preferable because an aperture ratio is reduced. Further, a known resist material (polymer material containing chromophore) can be also used.

Also, the surface of the photosensitive organic resin film 961 is covered with a nitride insulating film as a third passivation film 962, so that degassing from the photosensitive organic resin film 961 can be suppressed. In addition, the third passivation film 962 is etched on the pixel electrode 958 to provide an opening portion. In the opening portion, an EL layer 963 is in contact with the pixel electrode 958. The EL layer 963 is generally composed by laminating thin films such as a light emitting layer, a charge injecting layer, and a charge transporting layer. However, various structures and various materials in which light emission has been observed can be used. For example, SAlq (in which one of three ligands of $Alq_3$ is substituted for a triphenylsilanol structure) as an organic system material containing silicon can be also used as a charge transporting layer or a hole blocking layer.

Of course, the EL layer is not necessarily composed of only organic thin film, and a structure in which an organic thin film and an inorganic thin film are laminated may be also used. A polymer thin film or a low molecular thin film may be used. In addition, a forming method is changed according to whether a polymer thin film or a low molecular thin film is used. However, the thin film is preferably formed by a known method.

Also, a cathode 964 is formed on the EL layer 963, and a nitride insulating film as a fourth passivation film 965 is finally provided thereon. A metallic thin film containing an element belonging to group 1 or 2 of the periodic table is preferably used as the cathode 964. A metallic film in which lithium of 0.2 wt % to 1.5 wt % (preferably, 0.5 wt % to 1.0 wt %) is added to aluminum is suitable in view of a charge injecting property and the like. Note that, if lithium is diffused, it is concerned that the operation of a TFT is influenced thereby. However, according to this embodiment, the TFT is completely protected by the first passivation film 911, the second passivation film 913, and the third passivation film 962, so that it is unnecessary to concern the diffusion of lithium.

Figure 17A:
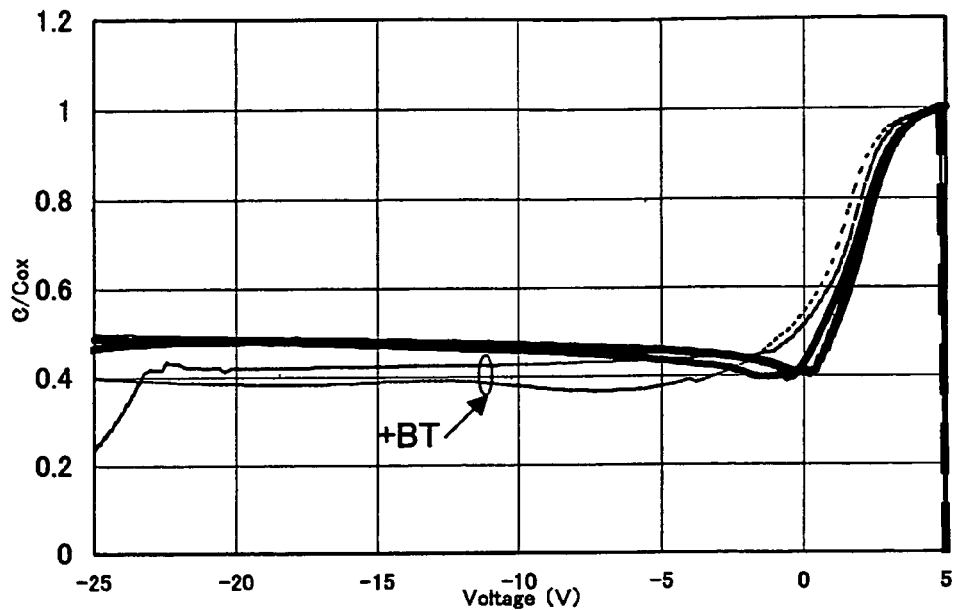
FIGS. 17A and 17B show C-V characteristics of an MOS structure in the case where a silicon nitride film is used as dielectric.
Figure 17B:
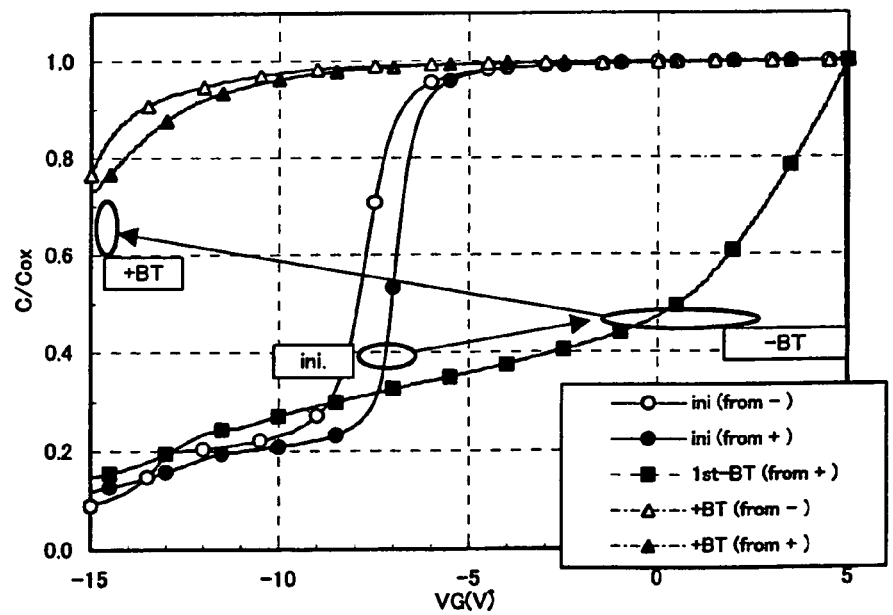

Here, data indicating a blocking effect of a silicon nitride film formed by a sputtering method using high frequency discharge with respect to lithium are shown in FIGS. 17A and 17B. FIG. 17A shows a C-V characteristic of an MOS structure in the case where a silicon nitride film formed by a sputtering method using high frequency discharge (indicated as RF-SP SiN) is used as dielectric. Note that "Li-dip" means that a solution containing lithium is spin-coated on the silicon nitride film and means that contamination is intentionally caused using lithium for a test. In addition, FIG. 17B shows a C-V characteristic of an MOS structure in the comparative case where a silicon nitride film formed by a plasma CVD method (indicated as CVD SiN) is used as dielectric. Note that, with respect to data shown in FIG. 17B, an alloy film in which lithium is added to aluminum is used as a metallic electrode. A general BT test is conducted for these films (specifically, heat treatment is conducted at ±150° C. for 1 hour in addition to the application of a voltage of 1.7 MV). As a result, as shown in FIG. 17A, a change in C-V characteristic in the case where the silicon nitride film formed by the sputtering method using high frequency discharge is hardly observed. On the other hand, a large change in C-V characteristic in the case where the silicon nitride film formed by the plasma CVD method is observed. Accordingly, contamination of lithium is recognized. These data suggest that the silicon nitride film formed by the sputtering method using high frequency discharge has a very effective blocking effect to lithium diffusion.

Further, when a nitride insulating film is used as the second passivation film 913 or the third passivation film 962, a heat radiation effect can be expected. For example, if it is assumed that a thermal conductivity of a silicon oxide film is 1, that of a silicon nitride film is about 5 and that of an aluminum nitride film is about 35 to 130, thereby obtaining a very high thermal conductivity. Thus, even when the EL element generates heat, heat is effectively radiated, so that the deterioration of the EL layer 963 resulting from self heat radiation can be suppressed.

Note that the same material as the nitride insulating film used for the first passivation film 911 and the second passivation film 913 can be used for the third passivation film 962 and the fourth passivation film 965.

When the structure shown in FIG. 10A is used, light emitted from the EL element transmits the pixel electrode 958 and exits from the substrate 901 side. At this time, the transmitting light transmits through the photosensitive organic resin film 912. Thus, it is required that sufficient decolorization processing is conducted for the photosensitive organic resin film 912 so that it is made sufficiently transparent.

Next, FIG. 10B shows an example in which a metallic film 971 having a reflecting property is used instead of the pixel electrode 958. As the metallic film 971 having the reflecting property, a film of metal such as platinum (Pt) or gold (Au) having a high work function is used to serve as an anode. In addition, because such a metal is expensive, it may be laminated on a suitable metallic film such as an aluminum film or a tungsten film to form a pixel electrode in which at least platinum or gold is exposed onto an uppermost surface. Reference numeral 972 denotes an EL layer, and various structures and various materials in which light emission has been observed can be used as in the case shown in FIG. 10A. In addition, reference numeral 973 denotes a metallic film having a small film thickness (preferably, 10 nm to 50 nm). A metallic film containing an element belonging to group 1 or 2 of the periodic table is used to serve as a cathode. Further, an oxide conductive film (typically, an ITO film) 974 is provided by laminating it on the metallic film 973 and a fourth passivation film 975 is provided thereon.

When the structure shown in FIG. 10B is used, light emitted from the EL element is reflected by the pixel electrode 971, transmits through the metallic film 973, the oxide conductive film 974, and the like, and exits from the substrate. At this time, because the light does not transmit through a portion under the pixel electrode 971, a memory element, a resistor element, or the like may be provided therein and the photosensitive organic resin film 912 may be colored. Thus, a degree of flexibility in a design is high and a manufacturing process can be also simplified. Therefore, it can be said that the structure generally contributes to a reduction in manufacturing cost.

Embodiment 3

In this embodiment, an example is indicated in which a connection structure between the drain wiring 921 and the pixel electrode 958 is modified in the light emitting device described in Embodiment 2. Note that the fundamental structure is not changed as compared with that shown in FIG. 9C. Thus, in this embodiment, reference symbols are provided to only necessary portions and the description will be made.

Figure 11A:
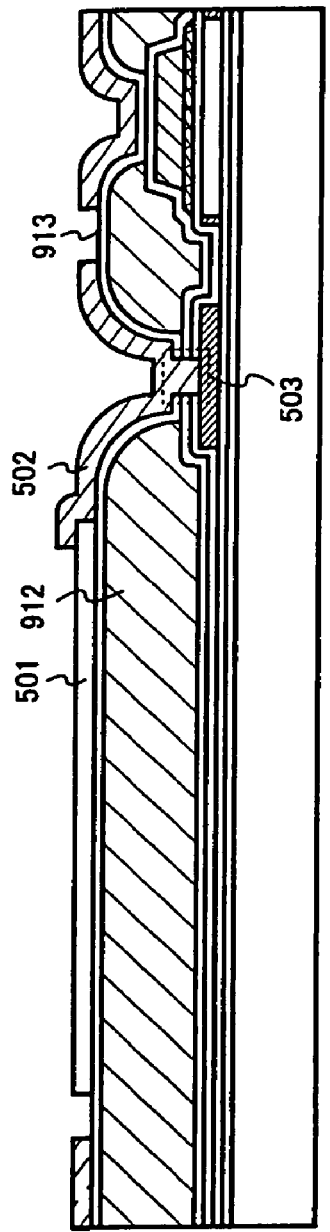
FIGS. 11A to 11C show cross sectional structures of the light emitting device.

As shown in FIG. 11A, a pixel electrode 501 made from an oxide conductive film is formed and then a drain wiring 502 is formed, so that a structure in which the drain wiring 502 is in contact with the pixel electrode 501 so as to cover the end portion thereof is obtained. When such a structure is obtained, the pixel electrode 501 may be formed after the formation of a second opening portion 503. Alternatively, the second opening portion 503 may be formed after the formation of the pixel electrode 501. In any case, even when dry etching processing is conducted, the photosensitive organic resin film 912 is always protected by the second passivation film 913 from plasma damage. Thus, there is no case where electrical characteristics of a thin film transistor are adversely influenced.

Figure 11B:
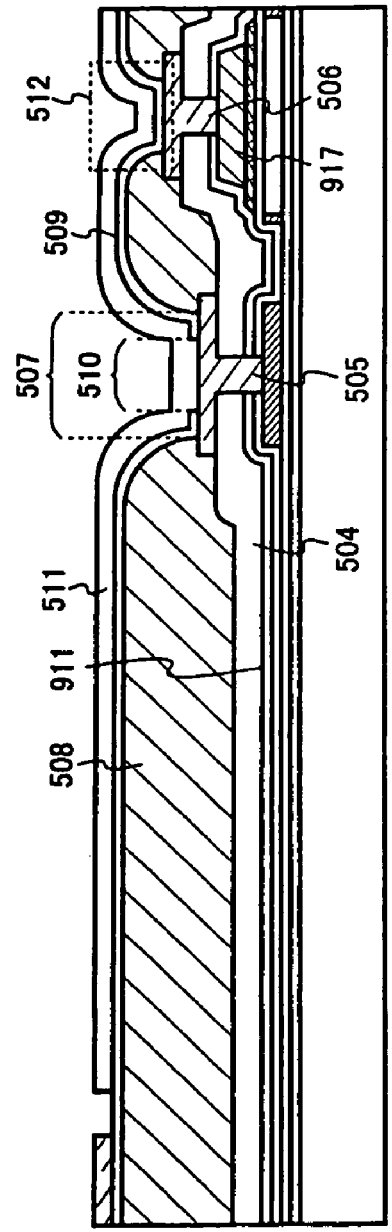

Next, as shown in FIG. 11B, an interlayer insulating film 504 made from an inorganic insulating film is provided on the first passivation film 911, and a drain wiring 505 is provided thereon. A connection wiring 506 is formed simultaneous with the drain wiring. The connection wiring 506 is connected with a capacitor wiring 917 of a lower layer. The drain wiring 505 and the connection wiring 506 are covered with a photosensitive organic resin film 508 having a first opening portion 507. The first opening portion 507 is covered with a second passivation film 509 made from a nitride insulating film. The second passivation film 509 has a second opening portion 510 in the bottom of the first opening portion 507. A pixel electrode 511 made from an oxide conductive film are connected with the drain wiring 505 through the first opening portion 507 and the second opening portion 510.

In this time, a storage capacitor 512 which is composed of the connection wiring 506, the second passivation film 509, and the pixel electrode 511 is produced on the connection wiring 506. In the case of the structure shown in FIG. 11B, only the second passivation film 509 having a high relative dielectric constant is used as dielectric, so that a storage capacitor having a large capacitance value can be produced. Of course, a storage capacitor using the pixel electrode 511 and the capacitor wiring 917 as a pair of electrodes can be also produced. However, in this case, because the second passivation film 509, the interlayer insulating film 504, and the first passivation film 911 are used as dielectric, a capacitance value becomes lower than that in the structure shown in FIG. 11B.

Figure 11C:
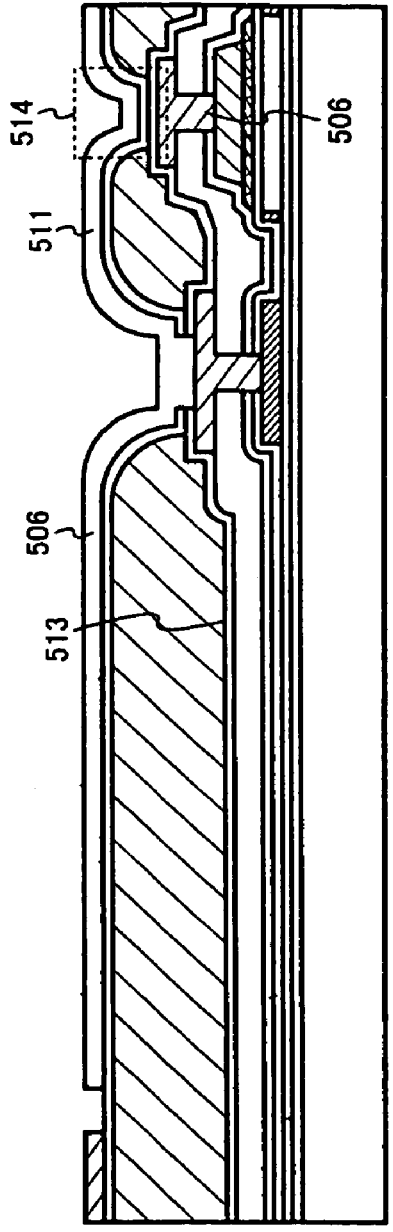

Next, FIG. 11C shows an example in which a nitride insulating film 513 is provided as another passivation film after the formation of the drain wiring 505 and the connection wiring 506 in FIG. 11B. In such a case, a storage capacitor 514 is composed of the connection wiring 506, the nitride insulating film 513, the second passivation film 509, and the pixel electrode 511. In this case, the film thickness is increased as compared with that in FIG. 11B, thereby slightly reducing a capacitance value. However, when a laminate is used for dielectric, a problem related to a pinhole, and the like can be reduced, so that the reliability of the storage capacitor is improved.

As described above, the present invention is not limited to the structure described in Embodiment 2, and therefore can be applied to various transistor structures using the organic resin film as the interlayer insulating film. Note that, in the structure described in this embodiment, the nitride insulating film described in Embodiments 1 and 2 above can be used for the second passivation film 509 and the nitride insulating film 513.

Embodiment 4

In this embodiment, an example in which a bottom gate thin film transistor (specifically, an inverse staggered TFT) is used as a thin film transistor in Embodiments 1 to 3 will be described. In other words, even when an inverse staggered TFT is used for the switching TFT and the driver TFT in Embodiment 2 or 3, the present invention can be carried out.

Figure 12:
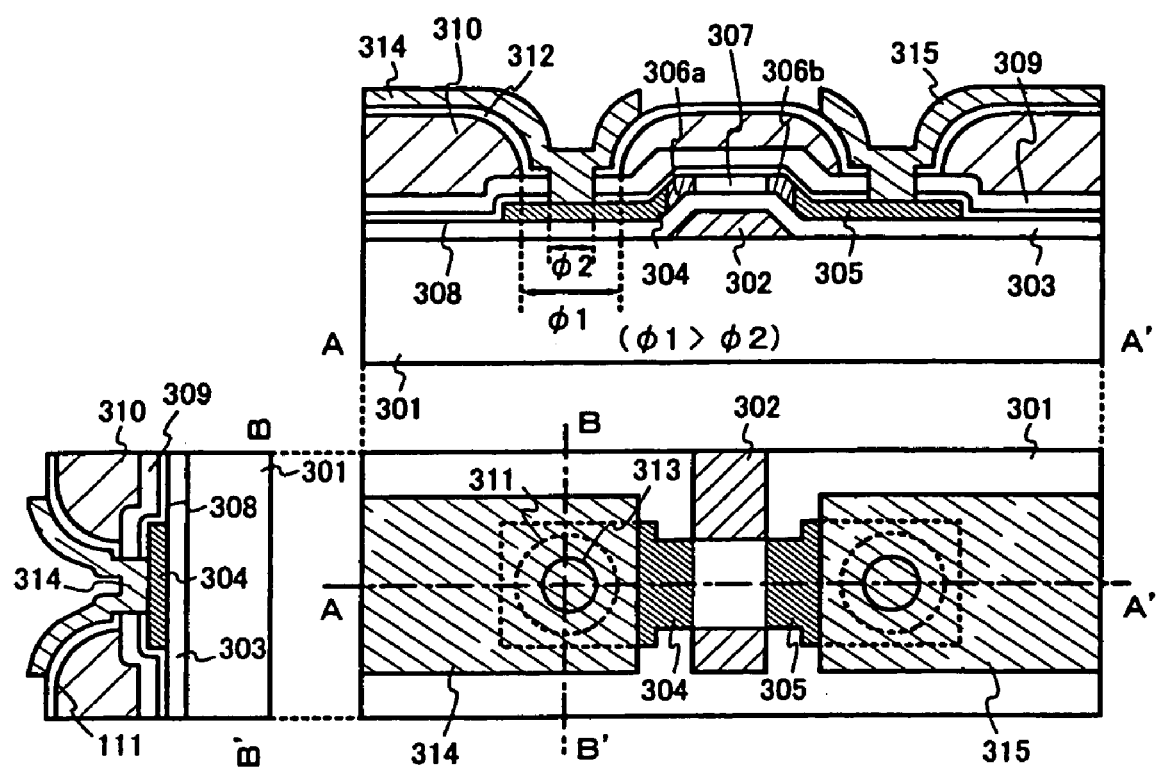
FIG. 12 shows a structure of a thin film transistor.

This embodiment will be described using FIG. 12. In FIG. 12, reference numeral 301 denotes a substrate, 302 denotes a gate electrode, 303 denotes a gate insulating film, 304 denotes a source region, 305 denotes a drain region, 306a and 306b denote LDD regions, and 307 denotes a channel formation region. The source region, the drain region, the LDD regions, and the channel formation region are made from a semiconductor film provided on the gate insulating film 302 covering the gate electrode 302. In addition, reference numerals 308 and 309 denote inorganic insulating films. In this embodiment, 308 denotes a silicon oxide film and 309 denotes a silicon nitride film. The silicon nitride film 309 serves as a first passivation film. The silicon oxide film 308 serves as a buffer layer between a semiconductor layer which becomes a lower layer and the first passivation film 309 made of silicon nitride. A known thin film transistor structure is described up to here. Various known materials can be used for materials of respective portions.

Next, a photosensitive organic resin film, specifically, a positive type photosensitive acrylic film is provided as an interlayer insulating film 310 on the first passivation film 309. A first opening portion (indicated by a diameter of $\phi 1$) 311 is provided in the photosensitive organic resin film 310. Further, a second passivation film 312 made from an inorganic insulating film is provided so as to cover the top surface of the photosensitive organic resin film 310 and the inner wall surface of the first opening portion 311. A second opening portion (indicated by a diameter of $\phi 2$) 313 is provided in the second passivation film 312 in the bottom of the first opening portion 311. Reference numeral 314 denotes a source electrode and 315 denotes a drain electrode.

Even in this embodiment, as in Embodiment 1, a silicon nitride film, a silicon nitride oxide film, a silicon oxynitride film, an aluminum nitride film, an aluminum nitric oxide film, or an aluminum oxynitride film can be used for the first passivation film 309 and the second passivation film 312. In addition, a laminate film including these films in at least a portion thereof can be used. It is desirable that the diameter of $\phi 1$ is set to 2 μm to 10 μm (preferably, 3 μm to 5 μm) and the diameter of $\phi 2$ is set to 1 μm to 5 μm (preferably, 2 μm to 3 μm). It is preferable that a relationship of $\phi 1 > \phi 2$ is satisfied. Note that, because the cross sectional shape of the first opening portion 311 has been described in detail in "Summary of the Invention", it is omitted here. It is desirable that an inner wall surface of the first opening portion is a gradual curved surface and has a continuously changed curvature radius. Specifically, when three points of curvature radii of R1, R2, and R3 are noted in order, it is desirable that a relationship among the respective curvature radii becomes R1<R2 <R3 and these numerical values each become within 3 μm to 30 μm (typically, 10 μm to 15 μm). In addition, an angle (contact angle θ) formed by the photosensitive organic resin film 310 and the first passivation film 309 in the bottom of the first opening portion 311 is preferably kept within a range of 30°<θ<65° (typically, 40°<θ<50°).

As described above, when the present invention is carried out, the structure of a thin film transistor is not necessarily limited to only a top gate type or only a bottom gate type. Thus, the present invention can be applied to a thin film transistor having any structure. Further, the present invention is not necessarily limited to a thin film transistor, and may be applied to a transistor having a MOS structure which is formed using a silicon well.

Embodiment 5

In this embodiment, an example in which the present invention is applied to a liquid crystal display device will be described. FIG. 13A is a plan view of a pixel of a liquid crystal display device (note that a state up to the formation of a pixel electrode is indicated), FIG. 13B is a circuit diagram thereof, and FIGS. 13C and 13D each are a cross sectional view along a line A-A' or B-B'.

As shown in FIGS. 13A and 13B, a display portion of the liquid crystal display device includes a plurality of pixels which are surrounded by gate wirings 851 and data wirings 852 and arranged in matrix. In each of the pixels, a TFT 853 serving as a switching element (hereinafter referred to as a switching TFT), a capacitor portion 854, and a liquid crystal element 855 are provided. In the circuit shown in FIG. 13B, both the capacitor portion 854 and the liquid crystal element 855 are connected with a constant potential line 856. However, they are not necessarily kept to the same potential, i.e., one may be kept to a common potential and the other may be kept to a ground potential (earth potential). In addition, although not shown here, the liquid crystal element can be formed by providing a liquid crystal layer over a pixel electrode 857. Note that, although in this embodiment, an n-channel TFT having a multi-gate structure is used as the switching TFT 853, a p-channel TFT may alternatively be used. The layout of the switching TFT is preferably determined as appropriate by an operator.

In the cross sectional view of FIG. 13C, the switching TFT 853 and the capacitor portion 854 are shown. Reference numeral 801 denotes a substrate, and a glass substrate, a ceramic substrate, a quartz substrate, a silicon substrate, or a plastic substrate (including a plastic film) can be used. In addition, reference numeral 802 denotes a silicon nitride oxide film, 803 denotes a silicon oxynitride film, and they are laminated-to serve as base films. Of course, the present invention is not necessarily limited to these materials. Further, an active layer of the switching TFT 853 is provided on the silicon oxynitride film 803. The active layer has a source region 804, a drain region 805, LDD regions 806a to 806d, and channel formation regions 807a and 807b. In other words, it has two channel formation regions and four LDD regions between the source region 804 and the drain region 805.

Also, the active layer of the switching TFT 853 is covered with a gate insulating film 808, and a gate electrode (gate electrode layers 809a and 809b) and another gate electrode (gate electrode layers 810a and 810b) are provided thereon. In this embodiment, a silicon oxynitride film is used as the gate insulating film 808. In addition, a tantalum nitride film is used for the gate electrode layers 809a and 810a and a tungsten film is used for the gate electrode layers 809b and 810b. With respect to these metallic films, a selection ratio is high. Thus, the structure as shown in FIG. 13B can be obtained by selecting an etching condition. The etching condition may be referred to JP 2001-313397 A according to the present applicant.

Also, a silicon nitride film or a silicon nitride oxide film is provided as a first passivation film 811 covering the gate electrodes, and a photosensitive organic resin film 812 (in this embodiment, a positive type photosensitive acrylic film is used) is provided thereon. Further, a second passivation film 813 is provided on the photosensitive organic resin film 812 so as to cover a first opening portion (see FIG. 1A). A second opening portion (see FIG. 1A) is provided to the bottom of the first opening portion. In this embodiment, a silicon nitride film or a silicon nitride oxide film is used as the second passivation film 813. Of course, another nitride insulating film such as an aluminum nitride film or an aluminum nitric oxide film can be also used.

Also, the data wiring 852 is connected with the source region 804 through the first opening portion, and the drain wiring 815 is connected with the drain region 805 through the second opening portion. The drain wiring 815 is used as an electrode composing a storage capacitor in the capacitor portion and electrically connected with the pixel electrode 857. Note that, in this embodiment, an oxide conductive film which is transparent with respect to visible light (typically, an ITO film) is used as the pixel electrode 857. However, the present invention is not limited to such a film. In addition, a structure in which a wiring containing mainly low resistance metal such as aluminum or copper is sandwiched by other metallic films or an alloy film of these metals is preferably used for the data wiring 852 and the drain wiring 815.

The drain wiring 815 is opposite to a capacitor wiring 816 which is formed together with the gate electrodes (that is, which is formed on the same surface as the gate electrodes) through the first passivation film 811 and the second passivation film 813, so that a storage capacitor 854a is produced. Further, the capacitor wiring 816 is opposite to a semiconductor film 817 through the gate insulating film 808 so that a storage capacitor 854b is produced. Because the semiconductor film 817 is electrically connected with the drain region 805, when a constant voltage is applied to the capacitor wiring 816, the semiconductor film serves as an electrode. Thus, the capacitor portion 854 becomes a structure in which the storage capacitors 854a and 854b are connected in parallel, thereby obtaining a large capacity with a very small area. Furthermore, with respect to particularly the storage capacitor 854a, a silicon nitride film having a high relative dielectric constant is used for dielectric, so that a large capacity can be ensured.

Figure 14A:
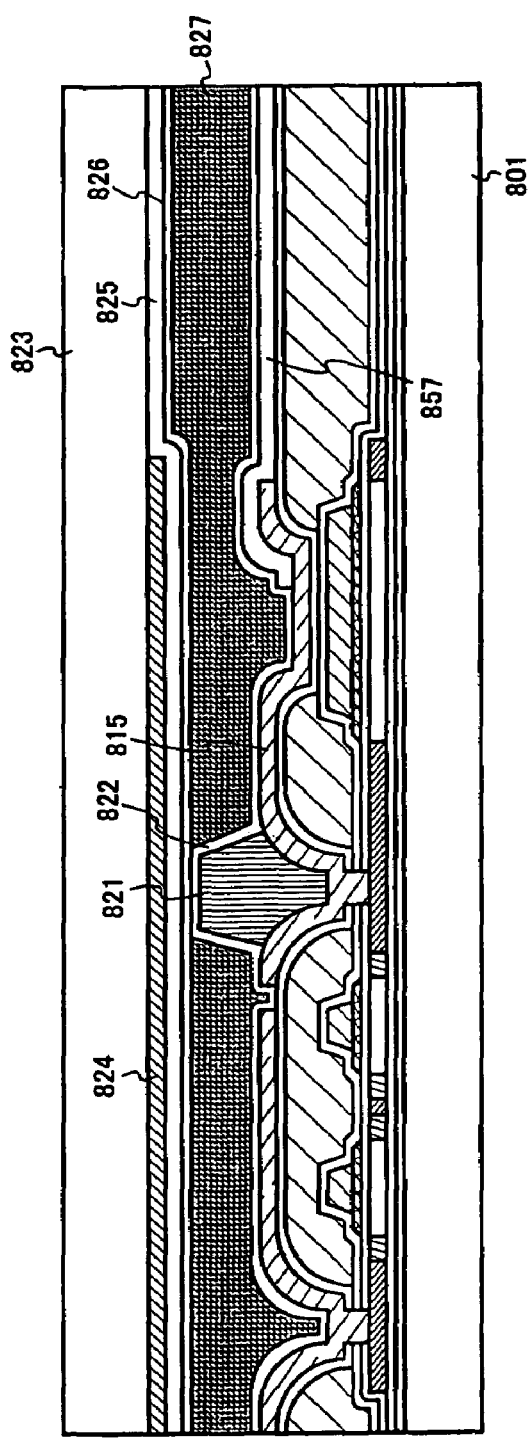
FIGS. 14A and 14B show cross sectional structures of the liquid crystal display device.
Figure 14B:
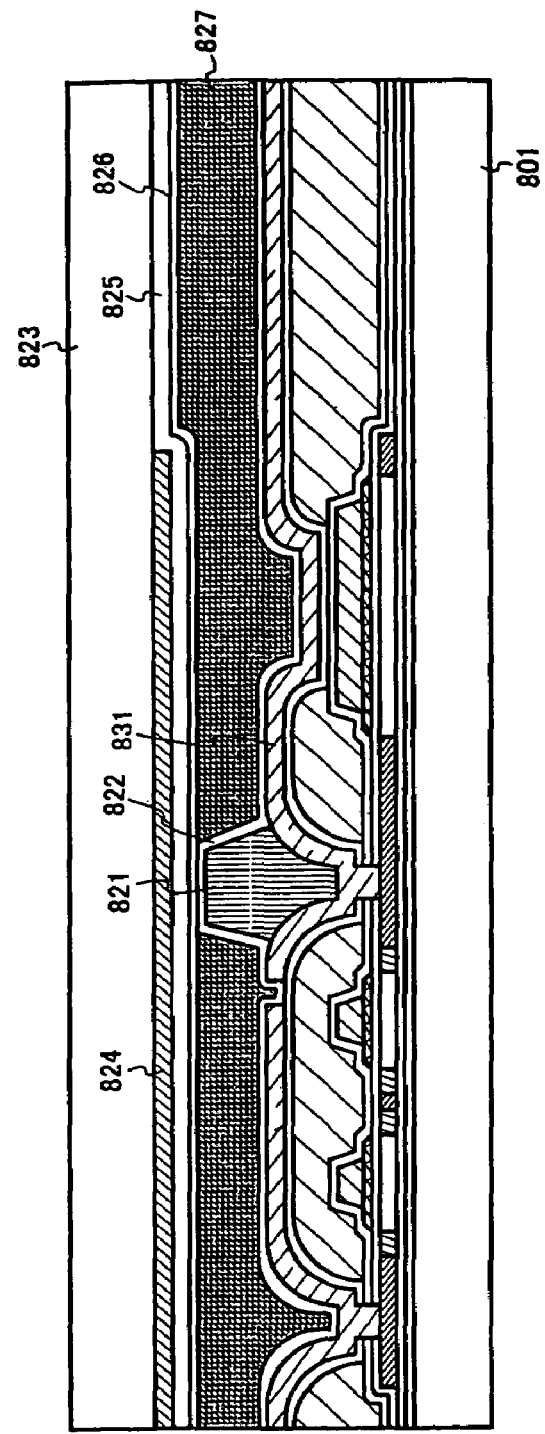

An example, up to the actual formation of a liquid crystal element of the liquid crystal display device having the above pixel structure is shown in FIGS. 14A and 14B. FIG. 14A is a cross sectional view corresponding to the cross section shown in FIG. 13C and shows a state in which the, liquid crystal element 855 is formed on the pixel electrode 857. A spacer 821 made of an organic resin is provided on the drain wiring 815, and an alignment film 822 is provided thereon. The formation order of the spacer 821 and the alignment film 822 may be reverse. Further, a light shielding film 824 made from a metallic film, a counter electrode 825 made from an oxide conductive film, and an alignment film 826 are provided on another substrate (counter substrate) 823, and then the alignment film 822 and the alignment film 826 are bonded opposite to each other using a sealing material (not shown).

Furthermore, a liquid crystal 827 is injected from a liquid crystal injection port provided in the sealing material, and the liquid crystal injection port is then sealed to complete the liquid crystal display device. Note that a general liquid crystal cell assembly process is preferably applied to a process after the formation of the spacer 821. Thus, the detailed description is not particularly made.

When the structure shown in FIG. 14A is used, light is made incident from the counter substrate 823 side, modulated through the liquid crystal 827, and exits from the substrate 801 side. At this time, the transmitting light transmits through the photosensitive organic resin film 812 used as the interlayer insulating film. Thus, it is required that sufficient decolorization processing is conducted for the photosensitive organic resin film 812 so that it is made sufficiently transparent.

Next, FIG. 14B shows an example in which a drain wiring 831 made from a metallic film having a reflecting property is used without modification instead of the pixel electrode 857. As the metallic film having the reflecting property, an aluminum film (including an aluminum alloy film) or a conductive film having a silver thin film at least on its surface can be used. The description related to other portions for which the same reference symbols as in FIG. 14A are provided is omitted here. When the structure shown in FIG. 14B is used, light is made incident from the counter substrate 823 side, modulated through the liquid crystal 827, and outputted from the counter substrate 823 side again. At this time, because the light does not transmit through a portion under the drain wiring 831, a memory element, a resistor element, or the like may be provided therein and the photosensitive organic resin film 812 may be colored. Thus, a degree of flexibility in a design is high and a manufacturing process can be also simplified. Therefore, it can be said that the structure generally contributes to a reduction in manufacturing cost.

Embodiment 6

In this embodiment, a structure of the entire light emitting device shown in FIGS. 9A to 9D will be described using FIGS. 15A to 15D. FIG. 15A is a plan view of a light emitting device produced by sealing an element substrate in which thin film transistors are formed with a sealing material. FIG. 15B is a cross sectional view along a line B-B' in FIG. 9A. FIG. 15C is a cross sectional view along a line A-A' in FIG. 15A.

A pixel portion (display portion) 402, a data line driver circuit 403, gate line driver circuits 404a and 404b, and a protective circuit 405, which are provided to surround the pixel portion 402, are located on a substrate 401, and a seal material 406 is provided to surround them. The structure of the pixel portion 402 preferably refers to FIGS. 10A and 10B and its description. As the seal material 406, a glass material, a metallic material (typically, a stainless material), a ceramic material, or a plastic material (including a plastic film) can be used. As shown in FIGS. 10A and 10B, it can be also sealed with only an insulating film. In addition, it is necessary to use a translucent material according to a radiation direction of light from an EL element.

The seal material 406 may be provided to partially overlap with the data line driver circuit 403, the gate line driver circuits 404a and 404b, and the protective circuit 405. A sealing material 407 is provided using the seal material 406, so that a closed space 408 is produced by the substrate 401, the seal material 406, and the sealing material 407. A hygroscopic agent (barium oxide, calcium oxide, or the like) 409 is provided in advance in a concave portion of the sealing material 407, so that it has a function of absorbing moisture, oxygen, and the like to keep an atmosphere clean in an inner portion of the above closed space 408, thereby suppressing the deterioration of an EL layer. The concave portion is covered with a cover material 410 with a fine mesh shape. The cover material 410 allows air and moisture to pass therethrough but not the hygroscopic agent 409. Note that the closed space 408 is preferably filled with a noble gas such as nitrogen or argon, and can-be also filled with a resin or a liquid if it is inert.

Also, an input terminal portion 411 for transmitting signals to the data line driver circuit 403 and the gate line driver circuits 404a and 404b is provided on the substrate 401. Data signals such as video signals are transferred to the input terminal portion 411 through a FPC (flexible printed circuit) 412. With respect to a cross section of the input terminal portion 411, as shown in FIG. 15B, an input wiring having a structure in which an oxide conductive film 414 is laminated on a wiring 413 formed together with a gate wiring or a data wiring is electrically connected with a wiring 415 provided in the FPC 412 side through a resin 417 to which conductors 416 are dispersed. Note that a spherical polymer compound for which plating processing using gold or silver is conducted is preferably used for the conductors 416.

Also, an enlarged view of a region 418 surrounded by a dot line in FIG. 15C is shown in FIG. 15D. The protective circuit 405 is preferably composed by combining a thin film transistor 419 and a capacitor 420, and any known structure may be used therefor. The present invention has such a feature that the formation of the capacitor is possible without increasing the number of photolithography steps together with the improvement of contact holes. In this embodiment, the capacitor 420 is formed utilizing the feature. Note that the structure of the thin film transistor 419 and that of the capacitor 420 can be understood if FIGS. 10A and 10B and description thereof are referred to, and therefore the description is omitted here.

In this embodiment, the protective circuit 405 is provided between the input terminal portion 411 and the data line driver circuit 403. When an electrostatic signal such as an unexpected pulse signal is inputted therebetween, the protective circuit releases the pulse signal to the outside. At this time, first, a high voltage signal which is instantaneously inputted can be dulled by the capacitor 420, and other high voltages can be released to the outside through a circuit composed of a thin film transistor and a thin film diode. Of course, the protective circuit may be provided in other location, for example, a location between the pixel portion 402 and the data line driver circuit 403 or locations between the pixel portion 402 and the gate line driver circuits 404a and 404b.

As described above, according to this embodiment, when the present invention is carried out, an example in which the capacitor used for the protective circuit for electrostatic measures and the like which is provided in the input terminal portion is simultaneously formed is indicated. This embodiment can be carried out by being combined with any structure of Embodiments 1 to 5.

Embodiment 7

Examples of electronics employing a display apparatus of the present invention to a display portion are: a video camera; a digital camera; a goggle type display (head mounted display); a navigation system; an audio reproducing apparatus (car audio, an audio component, and the like); a laptop computer; a game machine; a portable information terminal (a mobile computer, a cellular phone, a portable game machine, an electronic book, etc.); and an image reproducing apparatus including a recording medium (specifically, an appliance capable of processing data in a recording medium such as a Digital Versatile Disk (DVD) and having a display apparatus that can display the image of the data). Specific examples of the electronics are shown in FIGS. 16A to 16H.

Figure 16A:
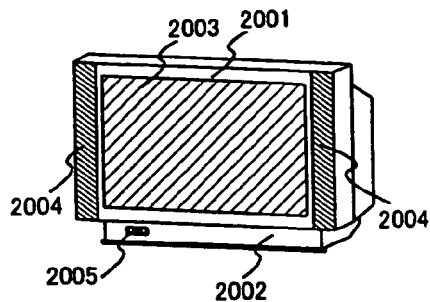
FIGS. 16A to 16H show specific examples of electrical appliances.

FIG. 16A shows a television, which comprises a casing 2001, a supporting base 2002, a display unit 2003, speaker units 2004, a video input terminal 2005, etc. The present invention is applied to the display unit 2003. The term television includes every television for displaying information such as one for a personal computer, one for receiving TV broadcasting, and one for advertisement.

Figure 16B:
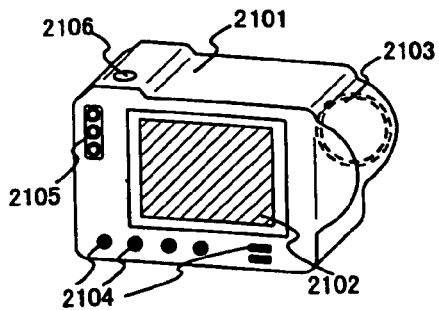

FIG. 16B shows a digital camera, which comprises a main body 2101, a display unit 2102, an image receiving unit 2103, operation keys 2104, an external connection port 2105, a shutter 2106, etc. The present invention is applied to the display unit 2102.

Figure 16C:
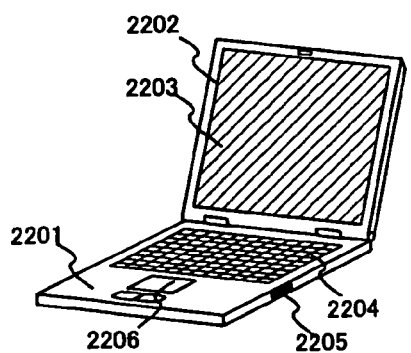

FIG. 16C shows a laptop computer, which comprises a main body 2201, a casing 2202, a display unit 2203, a keyboard 2204, an external connection port 2205, a pointing mouse 2206, etc. The present invention is applied to the display unit 2203.

Figure 16D:
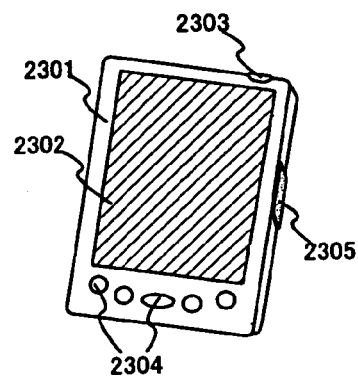

FIG. 16D shows a mobile computer, which comprises a main body 2301, a display unit 2302, a switch 2303, operation keys 2304, an infrared ray port 2305, etc. The present invention is applied to the display unit 2302.

Figure 16E:
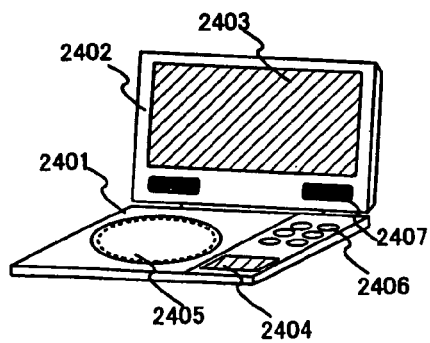

FIG. 16E shows a portable image reproducing apparatus equipped with a recording medium (a DVD player, to be specific). The apparatus comprises a main body 2401, a casing 2402, a display unit A 2403, a display unit B 2404, a recording medium (such as DVD) reading unit 2405, operation keys 2406, speaker units 2407, etc. The display unit A 2403 mainly displays image information whereas the display unit B 2404 mainly displays text information. The present invention is applied to the display units A 2403 and B 2404. The term image reproducing apparatus equipped with a recording medium includes domestic game machines.

Figure 16F:
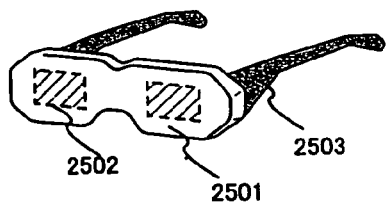

FIG. 16F shows a goggle type display (head mounted display), which comprises a main body 2501, display units 2502, and arm units 2503. The present invention is applied to the display unit 2502.

Figure 16G:
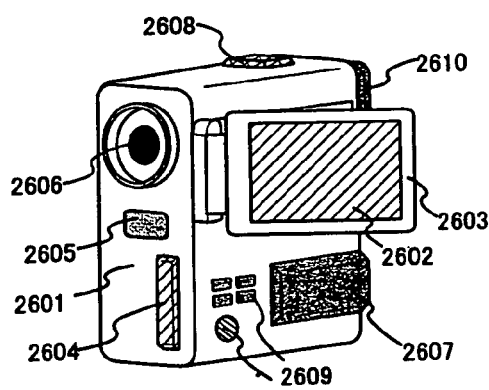

FIG. 16G shows a video camera, which comprises a main body 2601, a display unit. 2602, a casing 2603, an external connection port 2604, a remote control receiving unit 2605, an image receiving unit 2606, a battery 2607, an audio input unit 2608, operation keys 2609, etc. The present invention is applied to the display portion 2602.

Figure 16H:
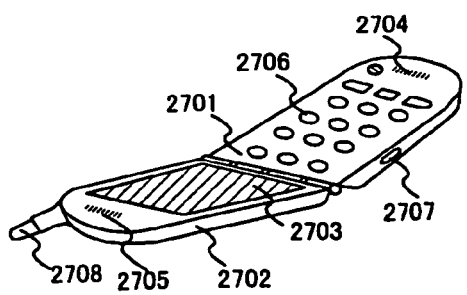

FIG. 16H shows a cellular phone, which comprises a main body 2701, a casing 2702, a display unit 2703, an audio input unit 2704, an audio output unit 2705, operation keys 2706, an external connection port 2707, an antenna 2708, etc. The present invention is applied to the display unit 2703. If the display unit 2703 displays white characters on a black background, power consumption of the cellular phone can be reduced.

As described above, the display apparatus obtained by applying the present invention may be used as the display units of every electronics. Low-cost display apparatus can be provided and the electronics parts cost can be lowered. Since the stability of the performance of the display apparatus can be improved and the design margin in the circuit design can be expanded in the present invention, the low-cost display apparatus can be provided and the electronics parts cost can be lowered. Also, the electronics of the present Embodiment may use any configuration of the display apparatuses shown in Embodiments 1 to 6.

According to the present invention, a display device can be manufactured without varying a threshold voltage of a thin film transistor by a process having a high design margin in a circuit design, so that the improvement of stability of operating performance of the display device can be achieved. Further, a large capacitor can be produced with a small area together with the above thin film transistor without increasing the number of photolithography steps, thereby improving an image quality of the display device.

What is claimed is:

1. A semiconductor device comprising:
a semiconductor having an active layer;
a gate insulating film in contact with the semiconductor;
a gate electrode opposite to the active layer through the gate insulating film;
a first insulating film formed over the active layer;
a second insulating film formed over the first insulating film;
a third insulating film formed over the second insulating film;
a wiring provided over the third insulating film;
a pixel electrode over and electrically connected to the wiring; and
a counter electrode opposed to the pixel electrode,
wherein a first opening portion is provided in the second insulating film, an inner wall surface of the first opening portion is covered with the third insulating film, a second opening portion is provided in a laminate including the gate insulating film, the first insulating film, and the third insulating film inside the first opening portion, the semiconductor is connected with the wiring through the first opening portion and the second opening portion, and a part of a top surface of the third insulating film contacts the wiring in the first opening portion.

2. A semiconductor device according to claim 1, wherein the second insulating film comprises a photosensitive organic resin film.

3. A semiconductor device according to claim 1, wherein the second insulating film comprises a positive type photosensitive acrylic resin film.

4. A semiconductor device according to claim 1, wherein the first insulating film and the third insulating film each are one selected from the group consisting of a silicon nitride film, a silicon nitride oxide film, a silicon oxynitride film, an aluminum nitride film, an aluminum nitric oxide film, and an aluminum oxynitride film.

5. A semiconductor device according to claim 1, wherein a curvature radius in a top end portion of the first opening portion is 3 μm to 30 μm.

6. A semiconductor device according to claim 1, wherein a curvature radius in a top end portion of the first opening portion is continuously changed in a range of 3 μm to 30 μm.

7. A semiconductor device according to claim 1, wherein a contact angle (θ) in a bottom end portion of the first opening portion satisfies 30°<θ<65°.

8. A semiconductor device comprising:
a semiconductor having an active layer;
a gate insulating film in contact with the semiconductor;
a gate electrode opposite to the active layer through the gate insulating film;
a first insulating film formed over the active layer;
a second insulating film formed over the first insulating film;
a third insulating film formed over the second insulating film;
a wiring provided on the third insulating film; and
a pixel electrode over and electrically connected to the wiring, wherein a first opening portion is provided in the second insulating film, an inner wall surface of the first opening portion is covered with the third insulating film, the first insulating film and the third insulating film are in contact with each other in a region of 0.3 µm to 3 µm in a bottom of the first opening portion, a second opening portion is provided in a laminate film including the gate insulating film, the first insulating film, and the third insulating film inside the first opening portion, the semiconductor is connected with the wiring through the first opening portion and the second opening portion, and a part of a top surface of the third insulating film contacts the wiring in the first opening portion.

9. A semiconductor device according to claim 8, wherein the second insulating film comprises a photosensitive organic resin film.

10. A semiconductor device according to claim 8, wherein the second insulating film comprises a positive type photosensitive acrylic resin film.

11. A semiconductor device according to claim 8, wherein the first insulating film and the third insulating film each are one selected from the group consisting of a silicon nitride film, a silicon nitride oxide film, a silicon oxynitride film, an aluminum nitride film, an aluminum nitric oxide film, and an aluminum oxynitride film.

12. A semiconductor device according to claim 8, wherein a curvature radius in a top end portion of the first opening portion is 3 µm to 30 µm.

13. A semiconductor device according to claim 8, wherein a curvature radius in a top end portion of the first opening portion is continuously changed in a range of 3 µm to 30 µm.

14. A semiconductor device according to claim 8, wherein a contact angle (θ) in a bottom end portion of the first opening portion satisfies 30°<θ<65°.

15. A display device comprising a pixel portion including a plurality of pixels in each of which a semiconductor element, a pixel electrode, a counter electrode and a storage capacitor connected with the semiconductor element are provided on a substrate,
    wherein the semiconductor element includes:
    a semiconductor having an active layer;
    a gate insulating film which is in contact with the semiconductor;
    a gate electrode opposite to the active layer through the gate insulating film;
    a first insulating film formed over the active layer;
    a second insulating film formed on the first insulating film;
    a third insulating film formed on the second insulating film; and
    a wiring provided on the third insulating film,
    wherein the pixel electrode over and electrically connected to the wiring,
    wherein the counter electrode is opposed to the pixel electrode,
    wherein a first opening portion is provided in the second insulating film, an inner wall surface of the first opening portion is covered with the third insulating film, a second opening portion is provided in a laminate including the gate insulating film, the first insulating film, and the third insulating film inside the first opening portion, the semiconductor is connected with the wiring through the first opening portion and the second opening portion, and a part of a top surface of the third insulating film contacts the wiring in the first opening portion, and
    wherein the storage capacitor includes the first insulating film and the third insulating film as dielectrics.

16. A display device according to claim 15, wherein the second insulating film comprises a photosensitive organic resin film.

17. A display device according to claim 15, wherein the second insulating film comprises a positive type photosensitive acrylic resin film.

18. A display device according to claim 15, wherein the first insulating film and the third insulating film each are one selected from the group consisting of a silicon nitride film, a silicon nitride oxide film, a silicon oxynitride film, an aluminum nitride film, an aluminum nitric oxide film, and an aluminum oxynitride film.

19. A display device according to claim 15, wherein a curvature radius in a top end portion of the first opening portion is 3 µm to 30 µm.

20. A display device according to claim 15, wherein a curvature radius in a top end portion of the first opening portion is continuously changed in a range of 3 µm to 30 µm.

21. A display device according to claim 15, wherein a contact angle (θ) in a bottom end portion of the first opening portion satisfies 30°<θ<65°.

22. A display device comprising a pixel portion including a plurality of pixels in each of which a semiconductor element, a pixel electrode, and a storage capacitor connected with the semiconductor element are provided on a substrate;
    wherein the semiconductor element includes:
    a semiconductor having an active layer;
    a gate insulating film which is in contact with the semiconductor;
    a gate electrode opposite to the active layer through the gate insulating film;
    a first insulating film formed over the active layer;
    a second insulating film formed on the first insulating film;
    a third insulating film formed on the second insulating film; and
    a wiring provided on the third insulating film,
    wherein the pixel electrode over and electrically connected to the wiring,
    wherein a first opening portion is provided in the second insulating film, an inner wall surface of the first opening portion is covered with the third insulating film, the first insulating film and the third insulating film are in contact with each other in a region of 0.3 µm to 3.0 µm in a bottom of the first opening portion, a second opening portion is provided in a laminate including the gate insulating film, the first insulating film, and the third insulating film inside the first opening portion, the semiconductor is connected with the wiring through the first opening portion and the second opening portion, and a part of a top surface of the third insulating film contacts the wiring in the first opening portion, and
    wherein the storage capacitor includes the first insulating film and the third insulating film as dielectrics.

23. A display device according to claim 22, wherein the second insulating film comprises a photosensitive organic resin film.

24. A display device according to claim 22, wherein the second insulating film comprises a positive type photosensitive acrylic resin film.

25. A display device according to claim 22, wherein the first insulating film and the third insulating film each are one selected from the group consisting of a silicon nitride film, a silicon nitride oxide film, a silicon oxynitride film, an aluminum nitride film, an aluminum nitric oxide film, and an aluminum oxynitride film.

26. A display device according to claim 22, wherein a curvature radius in a top end portion of the first opening portion is 3 µm to 30 µm.

27. A display device according to claim 22, wherein a curvature radius in a top end portion of the first opening portion is continuously changed in a range of 3 µm to 30 µm.

28. A display device according to claim 22, wherein a contact angle (θ) in a bottom end portion of the first opening portion satisfies 30°<θ<65°.

29. A display device comprising:
- a thin film transistor comprising a semiconductor film, provided over a substrate;
- a first insulating film formed over the thin film transistor;
- a second insulating film formed over the first insulating film;
- a third insulating film formed over the second insulating film
- a wiring provided over the third insulating film; and
- wherein a first opening portion is provided in the second insulating film, a second opening portion is provided in the first insulating film inside the first opening portion, and a part of a top surface of the third insulating film contacts the wiring in the first opening portion,
- wherein the wiring covers inner wall surfaces of the first opening portion and the second opening portion, and directly contacts the semiconductor film, and
- wherein a curvature radius in a top end portion of the first opening portion is continuously changed in a range of 3 µm to 30 µm.

30. A display device according to claim 29, wherein the second insulating film comprises a photosensitive organic resin film.

31. A display device according to claim 29, wherein the second insulating film comprises a positive type photosensitive acrylic resin film.

32. A display device according to claim 29, wherein the first insulating film is one selected from the group consisting of a silicon nitride film, a silicon nitride oxide film, a silicon oxynitride film, an aluminum nitride film, an aluminum nitric oxide film, and an aluminum oxynitride film.

33. A display device according to claim 29, wherein a contact angle (θ) in a bottom end portion of the first opening portion satisfies 30°<θ<65°.

* * * * *

UNITED STATES PATENT AND TRADEMARK OFFICE
CERTIFICATE OF CORRECTION

| | | |
|---|---|---|
| PATENT NO. | : 7,999,263 B2 | Page 1 of 1 |
| APPLICATION NO. | : 11/196251 | |
| DATED | : August 16, 2011 | |
| INVENTOR(S) | : Satoshi Murakami et al. | |

It is certified that error appears in the above-identified patent and that said Letters Patent is hereby corrected as shown below:

col. 3, line 62, "a thin film transistor Thus, it is" should read "a thin film transistor. Thus, it is"

col. 5, line 20, "wail surface of one opening portion" should read "wall surface of one opening portion"

col. 9, line 8, "TWT), a capacitor portion 956," should read "TFT), a capacitor portion 956,"

col. 19, line 42, "a display unit. 2602" should read "a display unit 2602"

Signed and Sealed this
Twenty-seventh Day of December, 2011

David J. Kappos
*Director of the United States Patent and Trademark Office*